United States Patent [19]
Sakurai

[11] Patent Number: 5,999,472
[45] Date of Patent: Dec. 7, 1999

[54] MULTI-BANK SYNCHRONOUS SEMICONDUCTOR MEMORY DEVICE WITH EASY CONTROL

[75] Inventor: Mikio Sakurai, Hyogo, Japan

[73] Assignee: Mitsubishi Denki Kabushiki Kaisha, Tokyo, Japan

[21] Appl. No.: 09/023,599

[22] Filed: Feb. 13, 1998

[30] Foreign Application Priority Data

Aug. 8, 1997 [JP] Japan .................................... 9-215001

[51] Int. Cl.$^6$ ........................................................ G11C 7/00
[52] U.S. Cl. ........................................ 365/222; 365/230.03
[58] Field of Search ................................. 365/222, 230.03

[56] References Cited

U.S. PATENT DOCUMENTS 4,933,907  6/1990  Kumanoya et al. .................... 365/222
5,463,590  10/1995  Watanabe ............................... 365/222

FOREIGN PATENT DOCUMENTS 5-135577  11/1998  Japan .

Primary Examiner—David Nelms
Assistant Examiner—M. Tran
Attorney, Agent, or Firm—McDermott, Will & Emery

[57] ABSTRACT

When refresh of a memory bank having a plurality of array banks is instructed, a refresh control circuit carries out the refresh by saving a row address latched in a row address latch circuit and a bank activation signal supplied to a bank drive unit respectively in a row address saving circuit and a bank activating information saving circuit. After the refresh completes, each array bank is returned to its original state before the refresh instruction is supplied, according to the saved row address and bank activate information. Accordingly, a synchronous semiconductor memory device in which the penalty at the time of the refresh is reduced is provided.

14 Claims, 18 Drawing Sheets

MULTI-BANK SYNCHRONOUS SEMICONDUCTOR MEMORY DEVICE WITH EASY CONTROL

BACKGROUND OF THE INVENTION

1. Field of the Invention

The present invention relates to a semiconductor memory device, and particularly to a semiconductor memory device having a plurality of memory cells which need refreshing of storage data within a prescribed time. The invention more particularly relates to a structure for refreshing in a multi-bank semiconductor memory device which has a plurality of memory banks and needs the refresh operation.

2. Description of the Background Art

In order to implement high-speed data transfer between a processing device such as a CPU (Central Processing Unit) and a DRAM (Dynamic Random Access Memory) as a main memory, a synchronous semiconductor memory device is used which inputs/outputs data in synchronization with a clock signal which is, for example, a system clock.

FIG. 16 shows states of external signals for a synchronous DRAM (SDRAM) which is one of conventional synchronous semiconductor memory devices. Referring to FIG. 16, in the SDRAM, an operation mode is determined by the combination of the states of respective external control signals /CS, /RAS, /CAS and /WE at the rising edge of an external clock signal CLK. In clock cycle #1, when chip selection signal /CS and row address strobe signal /RAS are set at L level, and the column address strobe signal /CAS and write enable signal /WE are set at H level at the rising edge of clock signal CLK, an active command is supplied and an operation for activating a memory cell array, that is, the row selecting operation, is carried out in the SDRAM. The row selection is carried out using an address signal ADD which is supplied simultaneously with the active command as a row address signal.

In clock cycle #3, when chip selection signal /CS and the column address strobe signal /CAS are set at L level and row address strobe signal /RAS and write enable signal /WE are set at H level at the rising edge of clock signal CLK, a read command of instructing reading of data is supplied. When the read command is supplied, an operation of selecting a memory cell column is carried out using address signal ADD which is applied currently as a column address signal, and data in a selected memory cell is read out. Since the SDRAM has a period referred to as CAS latency, read data Q attains a defined state after the period of the CAS latency. In the case shown in FIG. 16, the CAS latency is 1, so that read data Q attains a defined state at the rising edge of clock signal CLK in clock cycle #4. In the SDRAM, the read command is supplied to read out data of the number referred to as a burst length consecutively in each clock cycle using an address which is supplied simultaneously with the read command as a leading address. FIG. 16 shows a case in which data is read out with the burst length being 1.

In clock cycle #5, when chip selection signal /CS, column address strobe signal /CAS and write enable signal /WE are set at L level and row address strobe signal /RAS is set at H level, a write command of instructing writing of data is supplied. When the write command is supplied, a memory cell is selected using address signal ADD supplied currently as a column address, and data is written into a selected memory cell. When data is to be written, write data D is externally supplied simultaneously with the write command and taken into the SDRAM. Write data D which is taken therein is internally written into the selected memory cell at a prescribed timing. At the time of the data writing, data of the number of the burst length can also be written consecutively.

In the SDRAM, when the active command is supplied, the array attains an active state. In order to set the active array into a non-selected state, that is, a precharge state, chip selection signal /CS, row address strobe signal /RAS and write enable signal /WE are set at L level and the column address strobe signal /CAS is set at H level, and a precharge command is supplied in clock cycle #7. When the precharge command is given, the memory array which has been set in a selected state by the active command returns to the precharge state, and an internal selected row returns to the non-selected state.

In the SDRAM, a memory cell includes a capacitor which stores information therein as in a normal DRAM. Since the information stored in the capacitor needs to be refreshed within a prescribed period, chip selection signal /CS, row address strobe signal /RAS and write enable signal /WE are set at L level and column address strobe signal /CAS is set at H level in clock cycle #9. Accordingly, an auto-refresh command is supplied to automatically refresh a memory array. When the auto-refresh command is supplied, a refresh address which designates a memory cell to be refreshed is internally generated, data in the memory cell is refreshed according to the refresh address, and the memory array returns to the precharge state after the refresh completes.

As shown in FIG. 16, control signals are externally supplied synchronously with clock signal CLK, so that the internal operation starting timing can be determined using the rising edge of clock signal CLK as trigger. As a result, there is no need to consider a margin for internal operation timing which is necessary because of the skew or the like in the external control signals, and high-speed internal operation is implemented.

FIG. 17 schematically shows an internal configuration of a conventional SDRAM. Referring to FIG. 17, the SDRAM SD includes a plurality of memory banks BK0–BKn, and a data input/output buffer DB which is coupled commonly to memory banks BK0–BKn and inputs/outputs data. Each of memory banks BK0–BKn can be driven into active/inactive state regardless of the active/inactive state of other memory banks. For example, when memory bank BK0 is in the active state and a memory cell row is in the selected state, memory bank BK1 may be driven into the active state to drive a memory cell row into the selected state, and the memory cell row in the selected state may be driven into the non-selected state or the precharge state (inactive state).

The read command and the write command are supplied together with a bank address which designates a memory bank. Data can be input/output via data input/output buffer DB to/from the memory bank designated by the bank address. Therefore, at the time of access to one memory bank, other memory banks can be activated/inactivated to be sequentially accessed. Even at the time of page switching (to select a different word line), the memory array does not need to be set in the precharge state, so that data can be externally accessed consecutively. In particular, when data in a prescribed small area on a display screen is to be accessed in image processing, if memory banks BK0–BKn are configured to store pixel data on different scanning lines on the screen, data in the small area can be accessed at high-speed. In addition, when memory banks BK0–BKn are simultaneously set in the selected state, memory banks BK0–BKn can be utilized as the secondary cache, resulting in reduction of the penalty at the time of the cache miss.

FIG. 18 shows an entire configuration of the semiconductor memory device shown in FIG. 17 in detail. FIG. 18 presents a configuration having four banks as one example.

With reference to FIG. 18, the semiconductor memory device includes array banks 1a, 1b, 1c and 1d that can be driven into the active/inactive state independently of each other. The active state here represents a state in which a word line is selected in an array and a sense amplifier latches memory cell data, and the inactive state represents a state in which all word lines are in the non-selected state, the sense amplifier is in the inactive state, and each bit line of a bit line pair is precharged at a prescribed voltage level. Each of the array banks 1a–1d has the same configuration, and FIG. 18 shows the configuration of array bank 1a. Array bank 1a includes a memory array 1aa having a plurality of memory cells MCs arranged in rows and columns, and a row-related peripheral circuit 1ab which carries out an operation related to row selection in memory array 1aa. A word line WL is arranged corresponding to each row of memory cells MC, and a bit line pair BLP is arranged corresponding to each column of memory cells MC. FIG. 18 representatively shows one word line WL, one bit line pair BLP, and a memory cell MC placed at the crossing of them.

Row-related peripheral circuit 1ab includes a sense amplifier circuit provided to each bit line pair BLP, for differentially amplifying the potential of a corresponding bit line pair when activated, a bit line precharge circuit which precharges each bit line pair BLP to a prescribed potential level and others.

Bank drive circuits 2a, 2b, 2c and 2d for activating/inactivating corresponding array banks, as well as row address latches 3a, 3b, 3c and 3d are provided respectively to array banks 1a–1d. Each of bank drive circuits 2a–2d has the same configuration, and FIG. 18 shows a configuration of bank drive circuit 2a. Bank drive circuit 2a includes a row-related control circuit 2aa which controls an operation of row-related peripheral circuit 1ab of the corresponding array bank 1a according to a bank activation signal ACT0 from a bank activation control circuit 4, and a row selection circuit 2ab which decodes a row address signal RA0 supplied from a corresponding row address latch 3a and drives an addressed word line in corresponding memory array 1aa into the selected state according to the result of the decoding under the control by row-related control circuit 2aa. Row selection circuit 2ab includes a row decoder, and a word line drive circuit which drives an addressed word line into the selected state according to an output signal from the row decoder.

Row address latches 3a–3d each having a configuration described later in detail take in an address signal supplied according to a bank designation signal from bank activation control circuit 4, and latch and output the address signal. Operations of bank drive circuits 2a–2d and row address latches 3a–3d are controlled independently of each other under the control by bank activation control circuit 4.

Bank activation control circuit 4 receives an operation mode instruction signal from a command decoder 5 and a bank address signal BAi from an address buffer 6, and generates a control signal according to the operation mode instruction supplied from command decoder 5 for only a bank designated by bank address signal BAi. FIG. 18 exemplarily shows a configuration in which bank activation signals ACT0, ACT1, ACT2 and ACT3 are supplied from bank activation control circuit 4 to bank drive circuits 2a, 2b, 2c and 2d respectively. Bank activation control circuit 4 controls activation/inactivation of the bank activation signal according to an array activating instruction signal φa and a precharge instruction signal φp from command decoder 5 and bank address signal BAi from address buffer 6.

Command decoder 5 decodes signals supplied from a control signal input buffer 7 which in turn takes at the rising edge of clock signal CLK the signals /CS, /RAS, /CAS and /WE externally applied in synchronization with clock signal CLK, and generates the operation mode instruction signal according to the states of these signals. In some cases, command decoder 5 additionally uses a specific address signal bit supplied from address buffer 6 (the path is not shown) in order to generate the operation mode instruction signal. (This process is described later.)

Address buffer 6 takes externally supplied address signal AD and a bank address signal BA synchronously with the rising edge of clock signal CLK, and generates an internal address signal ADi and an internal bank address signal BAi.

The semiconductor memory device further includes a refresh control circuit 8 which generates a control signal necessary for the refresh according to a refresh mode instruction signal φr from command decoder 5 to execute the refresh operation, a refresh counter 19 which generates a refresh address designating a memory cell to be selected and refreshed under control by refresh control circuit 8, and a multiplexer 10 which selects either internal address signal ADi from address buffer 6 or the refresh address from refresh counter 9 and supplies the selected one to row address latches 3a–3d under the control by refresh control circuit 8.

Refresh control circuit 8 supplies bank activation control circuit 4 with a control signal necessary for the refresh operation when refresh instruction signal φr is supplied from command decoder 5. In the refresh mode, all memory array banks 1a—1a carry out the refresh operation via bank activation control circuit 4. Now, with reference to the timing chart shown in FIG. 19, an operation at the time of the refresh of the semiconductor memory device shown in FIG. 18 is described.

In clock cycle #0, row address strobe signal /RAS and chip selection signal /CS are set at L level and column address strobe signal /CAS and write enable signal /WE are set at H level, and an active command is supplied. When command decoder 5 receives the active command, command decoder 5 generates array activating instruction signal φa and supplies it to bank activation control circuit 4. When bank activation control circuit 4 receives array activating instruction signal φa, bank activation control circuit 4 supplies a latch instruction signal to a row address latch corresponding to a designated array bank according to bank address signal BAi supplied from address buffer 6, and drives array activation signal ACT for a corresponding bank drive circuit into the active state.

Multiplexer 10 has selected internal address signal ADi supplied from address buffer 6, and a row address latch provided corresponding to an array bank designated by the bank address takes the internal address signal supplied via multiplexer 10 and generates an internal row address signal RA. Accordingly, a bank drive circuit corresponding to an addressed bank is activated, and the row selecting operation is carried out in the designated bank.

Since the bank in the active state should be driven into the inactive state for the refresh operation, signals /CS, /RAS and /WE are set at L level and column address strobe signal /CAS is set at H level in clock cycle #3, and a precharge command is supplied. When the precharge command is supplied, command decoder 5 generates precharge instruction signal φd and supplies it to bank activation control circuit 4. For the precharge command, two kinds of precharge commands are supported. One is a single precharge command for returning only one bank to the precharge state, and the other is an all-bank precharge command for returning all banks to the precharge state simultaneously. The single precharge command and all-bank precharge command are set respectively by the H level and L level of a specific bit (bit A10 for example) of address signal AD. The precharge command causes the bank activation signal ACT for a bank in the active state to be driven into L level of the inactive state, and array banks 1a–1d return to the precharge state under the control by bank drive circuits 2a–2d respectively.

After an elapse of the clock cycles necessary for the precharge operation, chip selection signal /CS, row address strobe signal /RAS and the column address strobe signal /CAS are set at L level, and write enable signal /WE is set at H level in clock cycle #6. Command decoder 5 determines that a refresh command is supplied, according to the states of signals supplied from control signal input buffer 7, and generates refresh instruction signal φr for application to refresh control circuit 8. Refresh control circuit 8 starts refresh counter 9 according to refresh instruction signal φr and causes refresh counter 9 to generate a refresh address, and causes multiplexer 10 to select the refresh address from refresh counter 9.

Bank activation control circuit 4 drives array activation signals ACT0–ACT3 into the active state to activate all banks under the control signal from refresh control circuit 7. Accordingly, the refresh address from refresh counter 9 is latched in row address latches 3a–3d, bank drive circuits 2a–2d all operate, and memory cells of a row designated by the refresh address are refreshed in each of array banks 1a–1d. At the time of the refresh operation, array activation signals ACT0–ACT3 are driven into the active state only for a prescribed period. After an elapse of the prescribed period, array activation signals ACT0–ACT3 return to the inactive state. In clock cycle #9 in FIG. 19, array activation signals ACT0–ACT3 are driven into the inactive state. Accordingly, all banks can be refreshed, and storage data can be refreshed periodically.

FIG. 20 schematically shows a configuration of a processing system using the SDRAM. With reference to FIG. 20, SDRAM SD is connected to a memory controller MCT via a memory bus 11. Memory controller MCT is connected to a processor PU via a system bus 13. Memory controller MCT is also connected to a bank management memory BMM. Memory controller MCT causes processor PU to wait and sets processor PU in a waiting state via system bus 13 at an interval of a prescribed time. In this state, memory controller MCT issues a refresh instruction to SDRAM SD. In the normal access mode, memory controller MCT stores information on whether a bank is active or inactive as well as a bank row address indicating a selected row address of a bank in the active state in bank management memory BMM for each of the banks, and constantly manages the states of the respective banks in SDRAM SD.

After memory controller MCT carries out the refresh for SDRAM SD via memory bus 11, memory controller MCT returns SDRAM SD to a state before the refresh, referring to bank management memory BMM. In other words, memory controller MCT supplies an active command for a bank in the active state together with its row address. After the state of SDRAM SD is recovered, memory controller MCT allows processor PU to make an access. Therefore, processor PU cannot access SDRAM SD not only during the period in which the refresh is carried out for SDRAM SD, but also during the period from completion of the refresh to the time when SDRAM SD is returned to its original state, and the penalty due to the refresh increases.

In order to return SDRAM SD back to its original state after the refresh is completed, clock cycles equivalent in number to banks that are in the active state when the refresh instruction is supplied are necessary. It is because the active command is supplied together with only one bank address at a time, that is, the active command is supplied only to one bank at a time. Consequently, if the storage capacity of SDRAM SD as well as the number of its array banks increase, the number of clock cycles in which processor PU is caused to be in the waiting state at the time of the refresh increases, and the penalty for the refresh increases. In other words, when the refresh is carried out, processor PU cannot access SDRAM SD and is caused to be in the waiting state. As a result, an advantage of the bank configuration of SDRAM SD that sequentially activation of the banks allows accessing with no influence of a precharge time at the time of page switching of a bank is lost.

In addition, memory controller MCT stores information concerning states of respective banks in SDRAM SD in bank management memory BMM. If the number of banks in SDRAM SD increases, the capacity of bank management memory BMM also increases, so that a load for managing the state of each bank by memory controller MCT also increases.

An SDRAM having no bank also requires, after the refresh, a memory to be returned back to a state before the refresh under the control by an external memory controller. As a result, the SDRAM having no bank also has a problem of an increased load of the external memory controller after the refresh is completed.

SUMMARY OF THE INVENTION

One object of the present invention is to provide a semiconductor memory device in which a memory array can be returned back to a state before refresh easily without increasing the load of an external controller at the time when the refresh is completed.

Another object of the invention is to provide a multi-bank semiconductor memory device by which the penalty at the time of the refresh is reduced.

A semiconductor memory device according to the present invention includes: address generation circuitry including an address storage, for receiving an externally supplied address signal for storage in the address storage, and for generating an internal address signal; memory cell selection circuitry for selecting a memory cell addressed according to the internal address signal; address saving circuitry responsive to a refresh instruction, for receiving and holding the internal address signal stored in the address storage of the address generation circuitry; refresh activation circuitry responsive to the refresh instruction, for supplying a refresh address signal designating a memory cell to be refreshed to the memory cell selection circuitry via the address generation circuitry, and for activating the memory cell selection circuitry; and re-set circuitry for setting a memory cell being in the selected state when the refresh instruction was issued into the selected state again according to the saved address when the refresh operation by the refresh instruction completes.

When the refresh instruction is supplied, a current address signal is internally saved and the refresh is carried out. After the refresh completes, a memory cell is set in the selected state according to the saved address signal. Since inactivation of a memory array to which the refresh instruction is issued and re-activation of the memory array after the refresh are carried out within the memory device, an external controller does not need to monitor constantly an address in the selected state in the memory array, so that the load of the external controller is reduced. In addition, since re-selection of a memory cell is carried out internally according to the saved address signal after the refresh, even if a plurality of banks are provided, the plurality of banks can be driven into the active state again simultaneously, the period required for the processing from the completion of the refresh to the returning can be shortened, and the penalty at the refresh can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a timing chart representing an operation of a conventional synchronous semiconductor memory device.

DESCRIPTION OF THE PREFERRED EMBODIMENTS

First Embodiment

Figure 1:
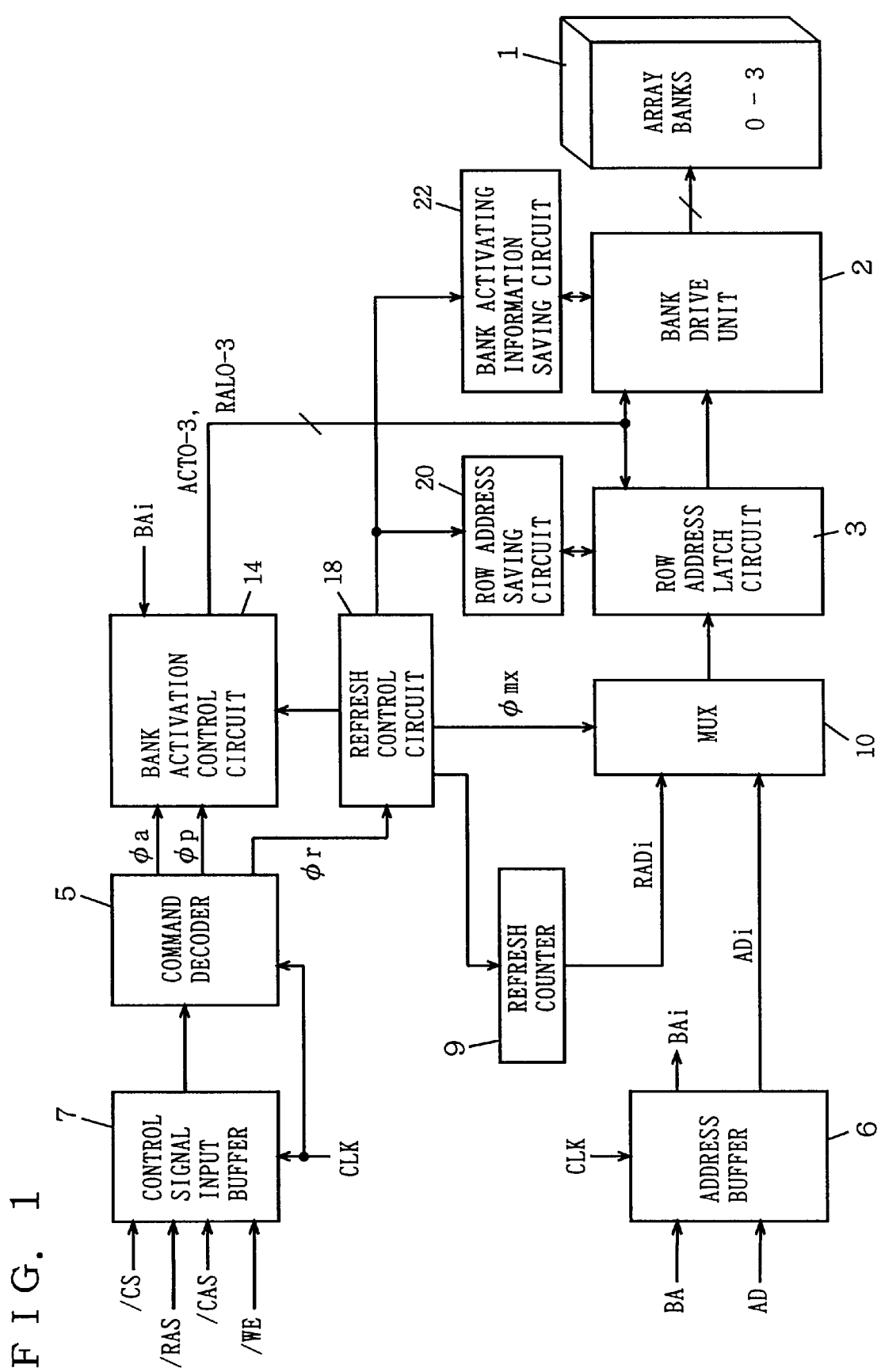
FIG. 1 schematically shows an entire configuration of a semiconductor memory device according to the first embodiment of the invention.
Figure 18:
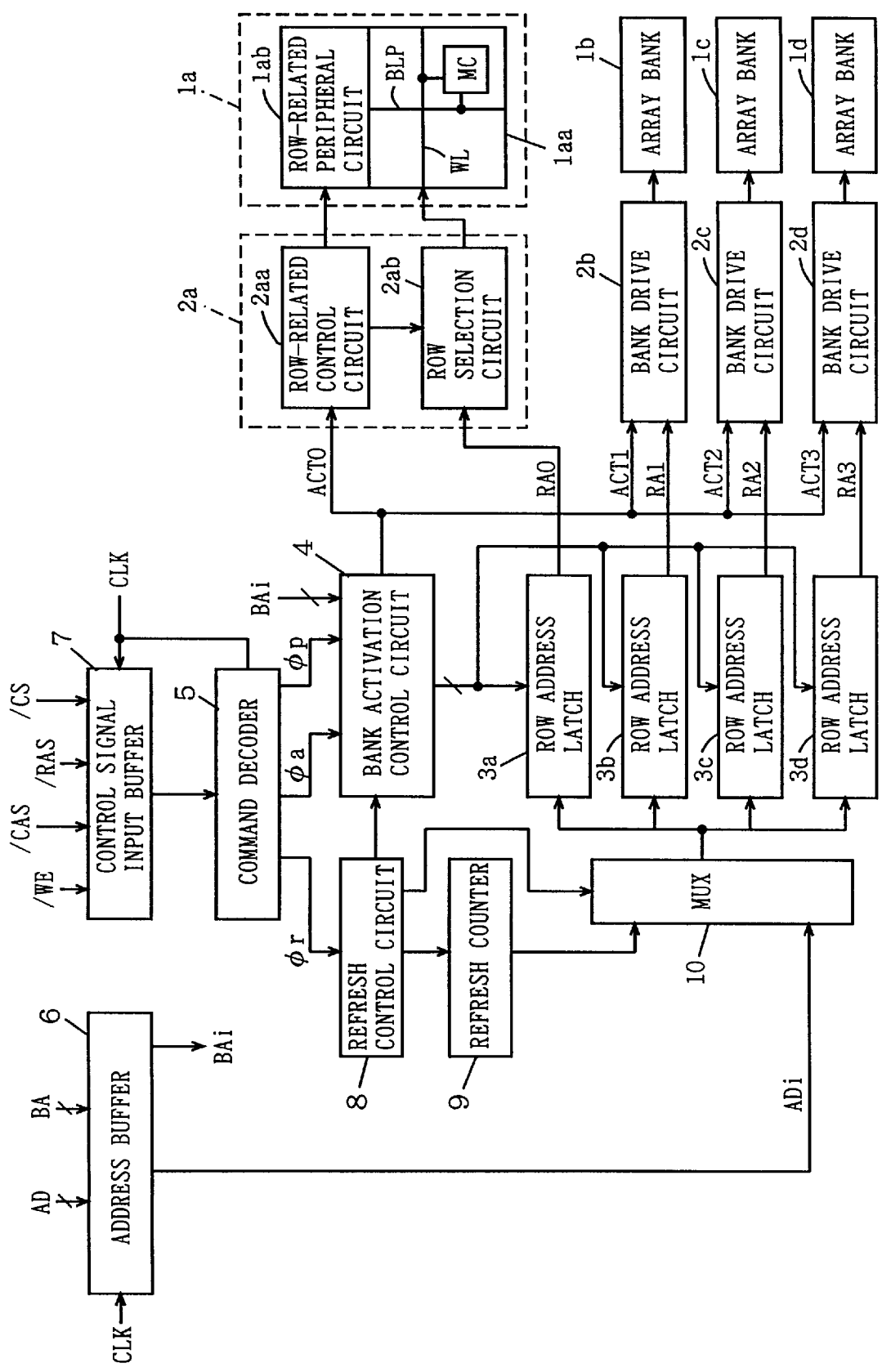
FIG. 18 shows an internal configuration of the conventional synchronous semiconductor memory device in detail.
Figure 19:
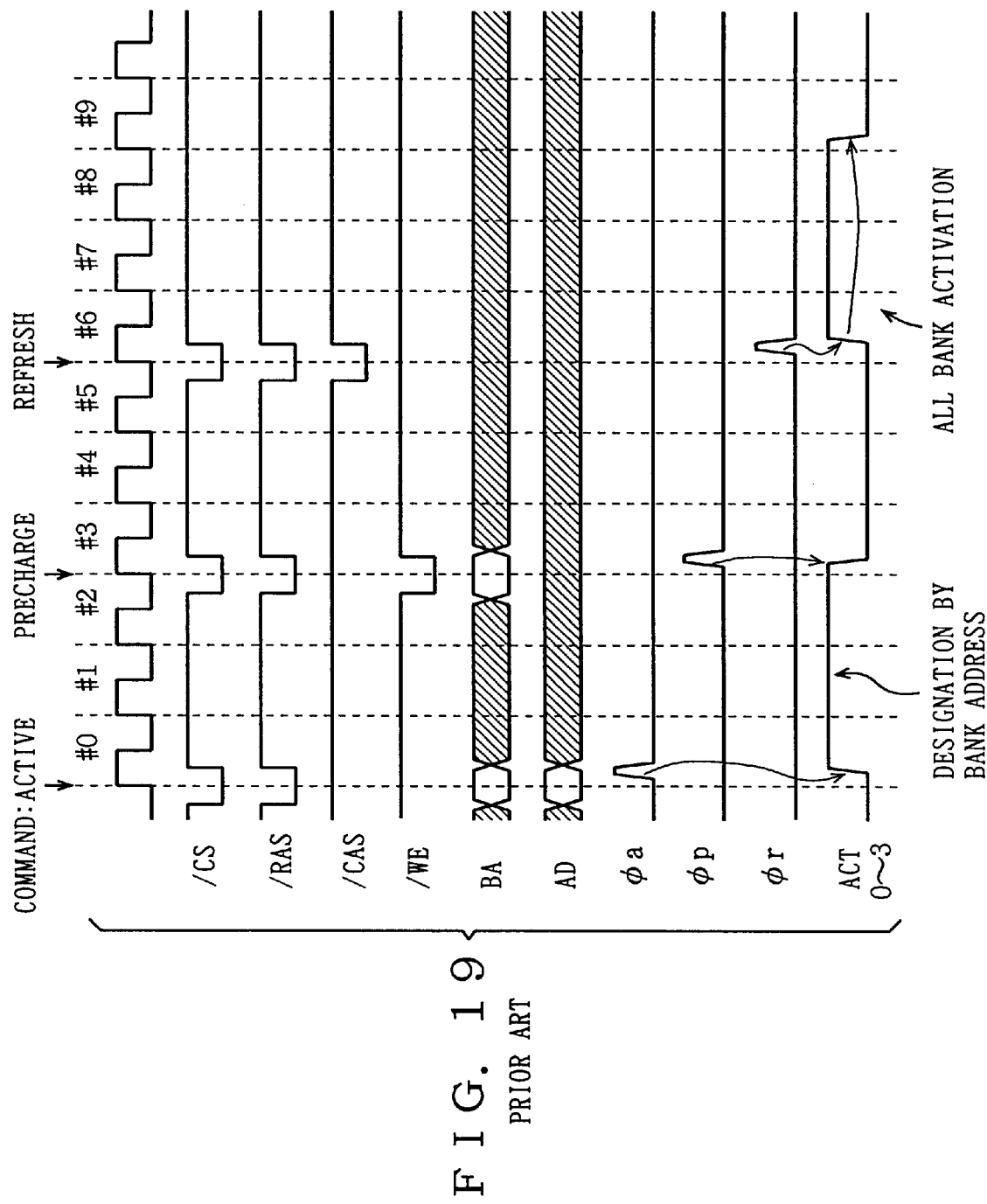
FIG. 19 a timing chart representing an operation of the synchronous semiconductor memory device in FIG. 18.
Figure 20:
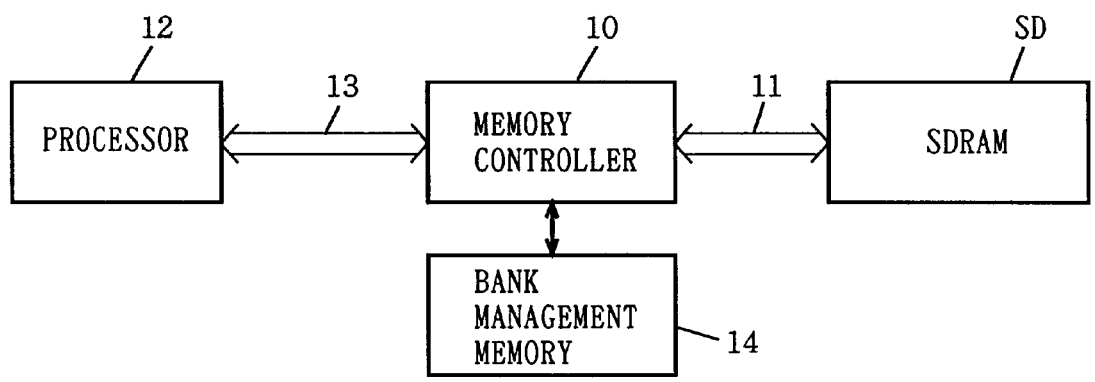
FIG. 20 is a diagram used for describing a problem of the conventional synchronous semiconductor memory device.

FIG. 1 schematically shows an entire configuration of a semiconductor memory device according to the first embodiment of the invention. Referring to FIG. 1, the semiconductor memory device includes a memory bank 1 having a plurality of array banks 0–3, a bank drive unit 2 for driving each array bank in memory bank 1 to the active/inactive state, and a row address latch circuit 3 for supplying a row address signal to bank drive unit 2. Bank drive unit 2 and row address latch circuit 3 respectively include a bank drive circuit and a row address latch provided corresponding to each of array banks 0–3 (banks 1a–1d in FIG. 18) of the memory bank 1 (see FIG. 18).

The semiconductor memory device further includes an address buffer 6 for taking externally supplied address signal AD and bank address signal BA in synchronization with clock signal CLK to generate internal address signal ADi and internal bank address signal BAi, a control signal input buffer 7 for taking externally supplied control signals /CS, /RAS, /CAS and /WE synchronously with clock signal CLK, and a command decoder 5 for determining a state of an internal control signal from control signal input buffer 7 at the rising of clock signal CLK to generate an operation mode instruction signal according to the result of determination. Command decoder 5, address buffer 6 and control signal input buffer 7 each have a configuration similar to that of the conventional semiconductor memory device.

The semiconductor memory device further includes a refresh control circuit 18 for generating a control signal necessary for the refresh according to refresh instruction signal φr from command decoder 5, and a bank activation control circuit 14 for outputting bank activation signals ACT0–3 according to array activating instruction signal φa and precharge instruction signal φp from command decoder 5, bank address signal BAi, and a control signal from refresh control circuit 18. Bank activation signals ACT0–3 from bank activation control circuit 14 are supplied to row address latch circuit 3 and bank drive unit 2. When bank activation signals ACT0–ACT3 are in the active state, corresponding array banks are maintained in the active state. When refresh control circuit 18 receives refresh instruction signal φr (refresh instruction signal φr becomes active), the control circuit 18 supplies a control signal to bank activation control circuit 14 and controls activation/inactivation of bank activation signals ACT0–ACT3.

The semiconductor memory device further includes a refresh counter 9 having its count value incremented or decremented by one each time the refresh is carried out under the control by refresh control circuit 18, a multiplexer (MUX) 10 for selecting either internal address signal ADi from address buffer 6 or refresh address signal RADi from refresh counter 9 and supplying the selected one to row address latch circuit 3 under the control by refresh control circuit 18, a row address saving circuit 20 for saving and storing a row address latched in row address latch circuit 3 under the control by refresh control circuit 18, and a bank activating information saving circuit 22 for saving and storing bank activation signals ACT0–ACT3 supplied to bank drive unit 2 at the time of the refresh operation under the control by refresh control circuit 18.

Multiplexer 10 selects refresh address signal RADi from refresh counter 9 and supplies it to row address latch circuit 3 when refresh control circuit 18 carries out the refresh operation. Row address saving circuit 20 saves a row address supplied to each array bank and latched in row address latch circuit 3 at the time of the refresh operation, and returns the saved row address back to an original row address latch after the refresh completes. Bank activating information saving circuit 22 also saves bank activation signals ACT0–ACT3 for respective array banks when the refresh is carried out, and returns them back to the original bank drive circuit after the refresh completes.

Figure 2:
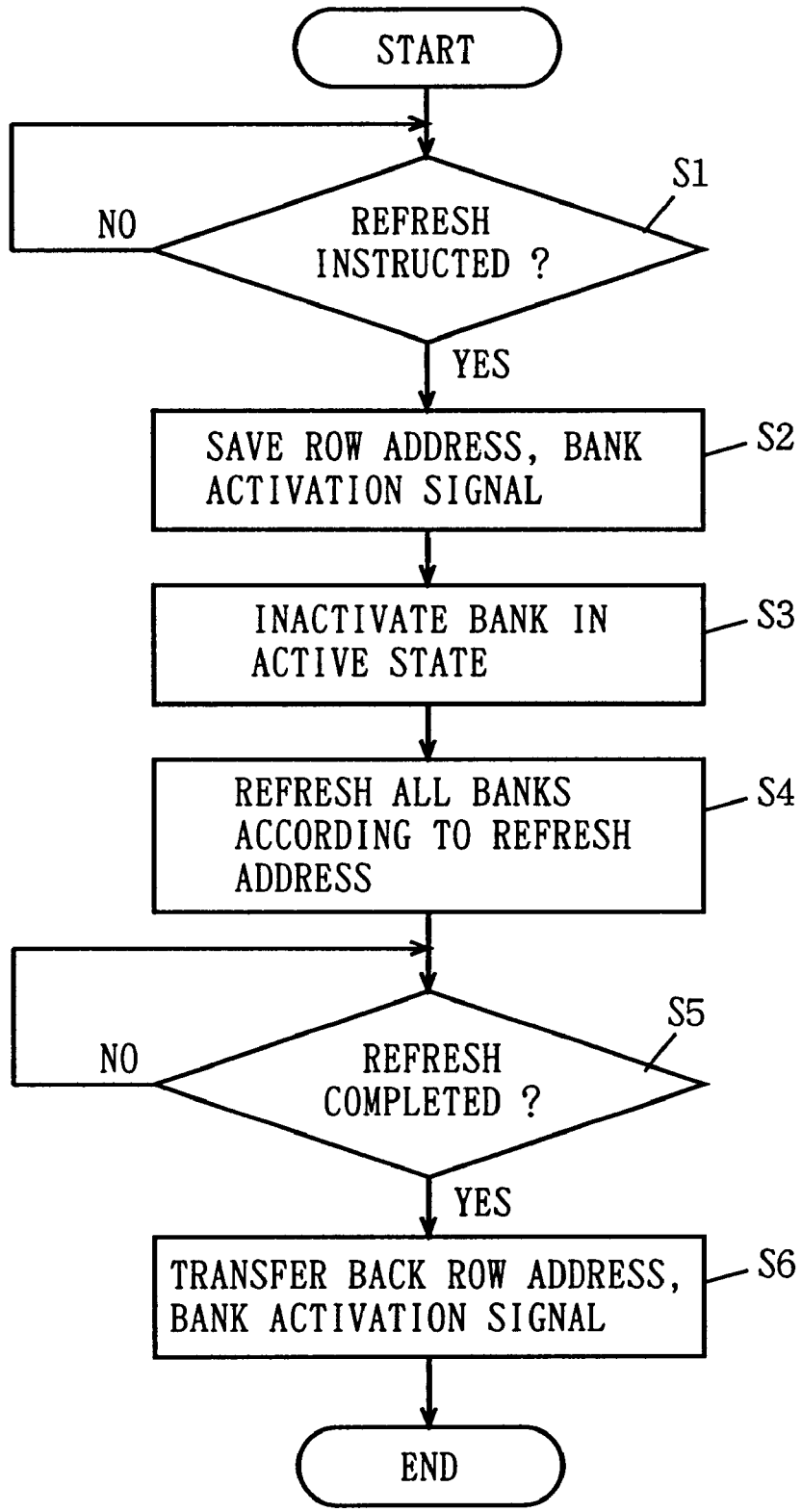
FIG. 2 shows a flow chart representing an operation of the semiconductor memory device according to the first embodiment of the invention at the time of the refresh.

With reference to the flow chart shown in FIG. 2, an operation of refresh control circuit 18 of the semiconductor memory device in FIG. 1 is described. Refresh control circuit 18 monitors whether a refresh instruction is supplied from command decoder 5 or not (step S1). Whether the refresh instruction is supplied or not is determined according to whether refresh instruction signal φr from the command decoder is generated (driven into the active state) or not. When refresh instruction signal φr is generated (activated), refresh control circuit 18 causes a row address for each array bank latched in row address latch circuit 3 to be saved in row address saving circuit 20, and causes a bank activation signal supplied to each bank drive circuit of the bank drive unit for each array bank to be saved and stored in bank activating information saving circuit 22, in order to carry out the refresh operation (step S2).

Refresh counter 9 is started to output refresh address signal RADi, and multiplexer (MUX) 10 selects refresh address signal RADi from refresh counter 9 and supplies it to row address latch 3. At this time, row address latch circuit 3 is in a latching state, so that a row address latched in row address latch circuit 3 does not change. Refresh control circuit 18 inactivates all of active banks after the row addresses and the bank activation signals are saved in row address saving circuit 20 and bank activating information saving circuit 22 (step S3). This process can be implemented by just supplying precharge instruction signals for all banks to bank activation control circuit 14.

Next, refresh control circuit 18 supplies an array activating instruction signal to bank activation control circuit 14 to drive all bank activation signals ACT0–ACT3 from bank activation control circuit 14 into the active state. At this time, bank activation control circuit 14 causes row address latch circuit 3 to latch refresh address RADi supplied via multiplexer 10. Bank drive unit 2 is then activated, the row select operation is carried out in array banks 0–3 included in memory bank 1, and memory cells connected to a selected row is refreshed (step S4). This refresh operation requires period in which a row (word line) is driven into the selected state in each of array banks 0–3, data of memory cells connected to a selected row are read onto bit lines, and data latched by the sense amplifier are written into the original memory cells again. A period in which a word line is maintained in the selected state in the refresh operation is determined in advance.

When the refresh operation completes (step S5), refresh control circuit 18 transfers row addresses and bank activating information (bank activation signal) saved in row address saving circuit 20 and bank activating information saving circuit 22 respectively back to row address latch circuit 3 and bank drive unit 2 (step S6). When those are transferred back, row address latch circuit 3 maintains its latching state with respect to multiplexer 10, and only latches a row address signal transferred back from row address saving circuit 20 again.

When the refresh operation completes, multiplexer (MUX) 10 is set in a state of selecting internal address signal ADi supplied from address buffer 6 under control by refresh control circuit 18. A count value (refresh address) of refresh counter 9 may be incremented or decremented by one before the refresh operation, or may be done so when the refresh operation completes.

As described above, when the refresh instruction is supplied, an address which is in the active state is internally saved, and the refresh operation is carried out for all array banks according to a refresh address under the state in which the address signal is saved. When the refresh completes, the save row address in the active state is transferred back, and memory bank 1 returns to a state before the refresh according to the row address and the bank activating information that have been transferred back.

An external controller only supplies a refresh instruction, and does not need to manage information on activation/inactivation of each bank and a row address having a corresponding word line being in the selected state in the active bank when the refresh instruction is applied, so that the load of the external controller is reduced. In the return from the refresh to the original state, all array banks which were in the active state when the refresh instruction was supplied internally return back to the active state simultaneously. As a result, it is not necessary to externally supply an active command and a bank address signal for sequentially driving array banks into the active state in the return from the refresh, high-speed return to a state before refresh is implemented, and the penalty at the time of refresh can be reduced.

Figure 3:
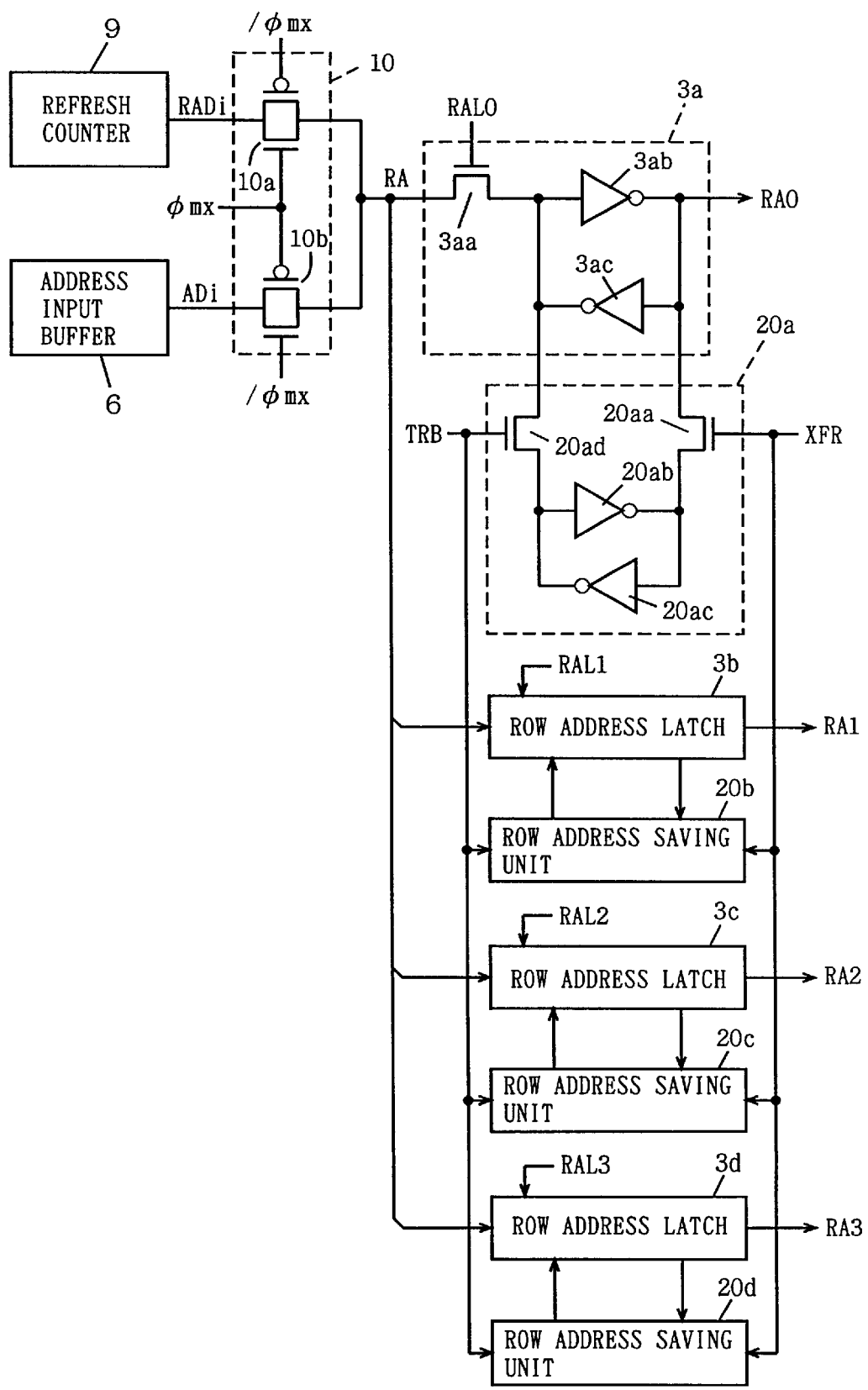
FIG. 3 schematically shows configurations of a row address latch circuit and a row address saving circuit of the semiconductor memory device shown in FIG. 1.

FIG. 3 exemplarily shows configurations of multiplexer 10, row address latch circuit 3 and row address saving circuit 20 shown in FIG. 1. Referring to FIG. 3, row address latch circuit 3 includes row address latches 3a, 3b, 3c and 3d provided corresponding to array banks 0–3 respectively, and row address saving circuit 20 includes row address saving units 20a, 20b, 20c and 20d provided corresponding to row address latches 3a–3d respectively. Row address latches 3a–3d each have the same configuration and FIG. 3 shows a configuration of row address latch 3a specifically. Row address saving units 20a–20d each have the same configuration and FIG. 3 shows a specific structure of row address saving unit 20a.

Row address latch 3a includes a transfer gate 3aa made conductive in response to activation of row address latch instruction signal RAL0 from bank activation control circuit 14 (see FIG. 1) for transmitting internal row address signal RA from multiplexer 10, and inverters 3ab and 3ac for latching internal row address signal RA transmitted from transfer gate 3aa to generate internal row address signal RA0 for array bank 0. An output of inverter 3ab is connected to an input of inverter 3ac, an output of inverter 3ac is connected to an input of inverter 3ab and these inverters 3ab and 3ac constitute a so-called inverter latch.

Row address latches 3b, 3c and 3d, in response to activation of respective row address latch instruction signals RAL1, RAL2, and RAL3, take internal row address signal RA supplied from multiplexer 10, and generate internal row address signals RA1, RA2 and RA3 for corresponding array banks 1–3 respectively.

Row address saving circuit 20a which will be described later in detail includes a transfer gate 20aa made conductive when a transfer instruction signal XFR from refresh control circuit 18 is activated, for transferring internal row address signal RA0 latched in row address latch 3a, inverters 20ab and 20ac for latching internal row address signal RA0 transmitted via transfer gate 20aa, and a transfer gate 20ad made conductive when a transfer back instruction signal TRB from refresh control circuit 18 is activated, for transferring back the internal row address signal latched by inverters 20*ab* and 20*ac* to row address latch 3*a*. An output of inverter 20*ab* is connected to an input of inverter 20*ac*, an output of inverter 20*ac* is connected to an input of inverter 20*ab*, and they constitute an inverter latch. Transfer instruction signal XFR is commonly applied to row address saving circuits 20*a*, 20*b*, 20*c* and 20*d*, and transfer back instruction signal TRB is also commonly supplied to row address saving units 20*a*, 20*b*, 20*c* and 20*d*.

Figure 4:
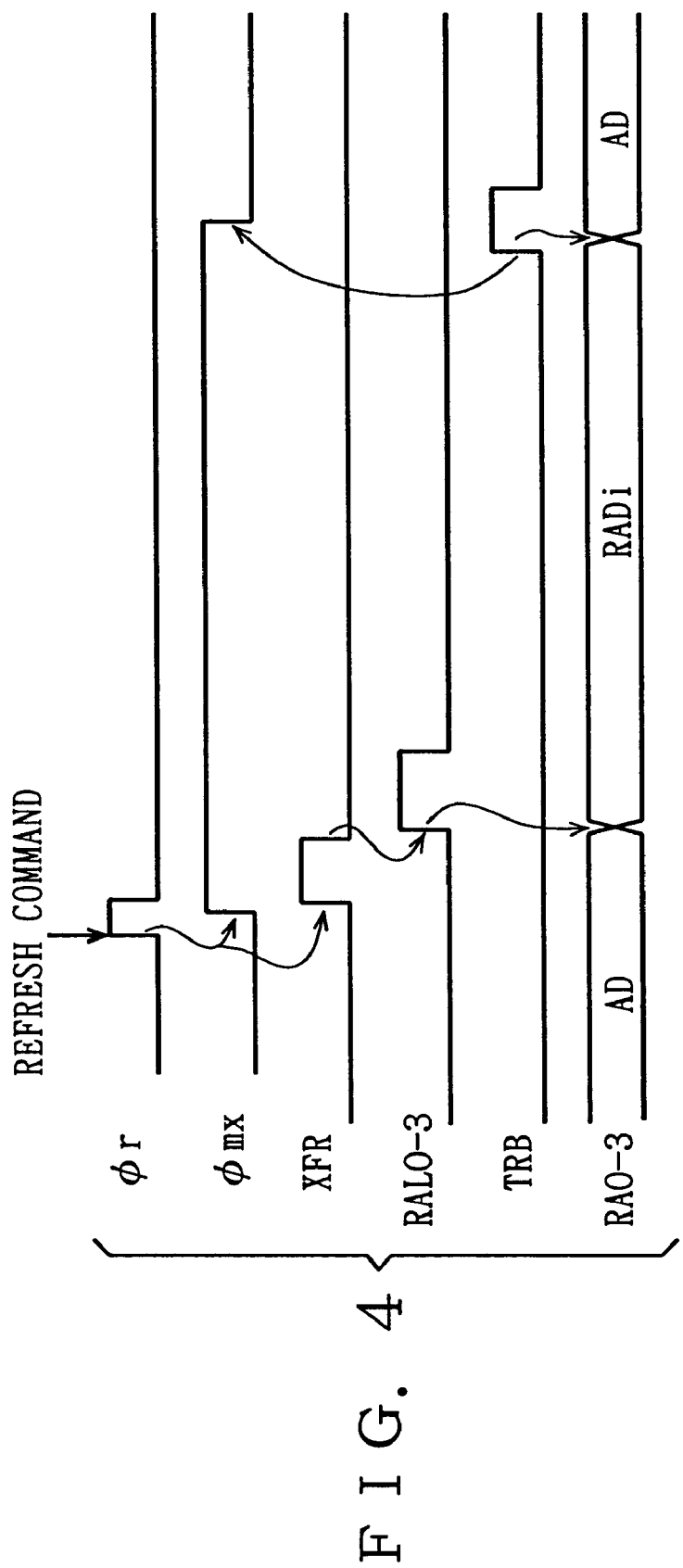
FIG. 4 is a signal waveform diagram representing an operation of the circuits in FIG. 3.

Multiplexer 10 includes a transmission gate 10*a* made conductive when switch instruction signal φmx and /φmx from refresh control circuit 18 are activated, for selecting refresh address signal RADi from refresh counter 9 and transmitting it to row address latches 3*a*–3*d*, and a transmission gate 10*b* made conductive when switch signals φmx and /φmx are inactivated, for selecting internal address signal ADi supplied from address input buffer 6 and transmitting it to row address latches 3*a*–3*d*. Switch signals φmx and /φmx are activated when the refresh instruction is supplied. Referring to the signal waveform diagram shown in FIG. 4, an operation of the configuration in FIG. 3 will now be described.

When a refresh command is supplied, refresh instruction signal φr is activated and switch signal φmx is responsively activated. In response to the activation of switch signal φmx, transmission gate 10*a* becomes conductive and multiplexer 10 selects refresh address RADi from refresh counter 9 and supplies it to row address latches 3*a*–3*d*. At this time, latch instruction signals RAL0–RAL3 are in the inactive state yet, and row address latches 3*a*–3*d* do not take the refresh address therein.

In response to the activation of refresh instruction signal φr, saving instruction signal XFR is activated, transfer gate 20*aa* becomes conductive, and address AD latched, in row address latch 3*a* is transferred to row address saving unit 20*a* and stored therein. In row address latches 3*b*, 3*c* and 3*d*, row address signals stored in row address latches 3*b*–3*d* respectively are transferred to corresponding row address saving units 20*b*–20*d* and stored therein according to saving instruction signal XFR. After the saving operation completes, row address latch instruction signals RAL0–RAL3 all are activated for a prescribed period, row address latches 3*a*–3*d* take and latch refresh address signal RADi supplied from multiplexer 10 therein, for output as internal row address signals RA0–RA3, respectively. According to the refresh address, the refresh operation is carried out in the respective array banks 0–3 included in memory bank 1 under the control by bank activation control circuit 14 shown in FIG. 1.

When the refresh operation completes, transfer instruction signal TRB is activated for a prescribed period, transfer gates (transfer gate 20*ad*) of row address saving units 20*a*–20*d* become conductive, and the saved row address signals are transferred back to corresponding row address latches 3*a*–3*d*. According to the activation of transfer back instruction signal TRB, switch instruction signal φmx is inactivated, transmission gate 10*b* becomes conductive, and multiplexer 10 selects internal address signal ADi from address input buffer 6.

When the refresh instruction is supplied, an internal row address signal stored in the row address latch is saved in a corresponding one of row address saving units 20*a*–20*d*, a refresh address is stored in the row address latch, and the refresh is carried out according to the refresh address signal. When the refresh completes, the saved address signal is transferred back to a corresponding row address latch, so that the semiconductor memory device can be returned back to a state before the refresh again.

Figure 5:
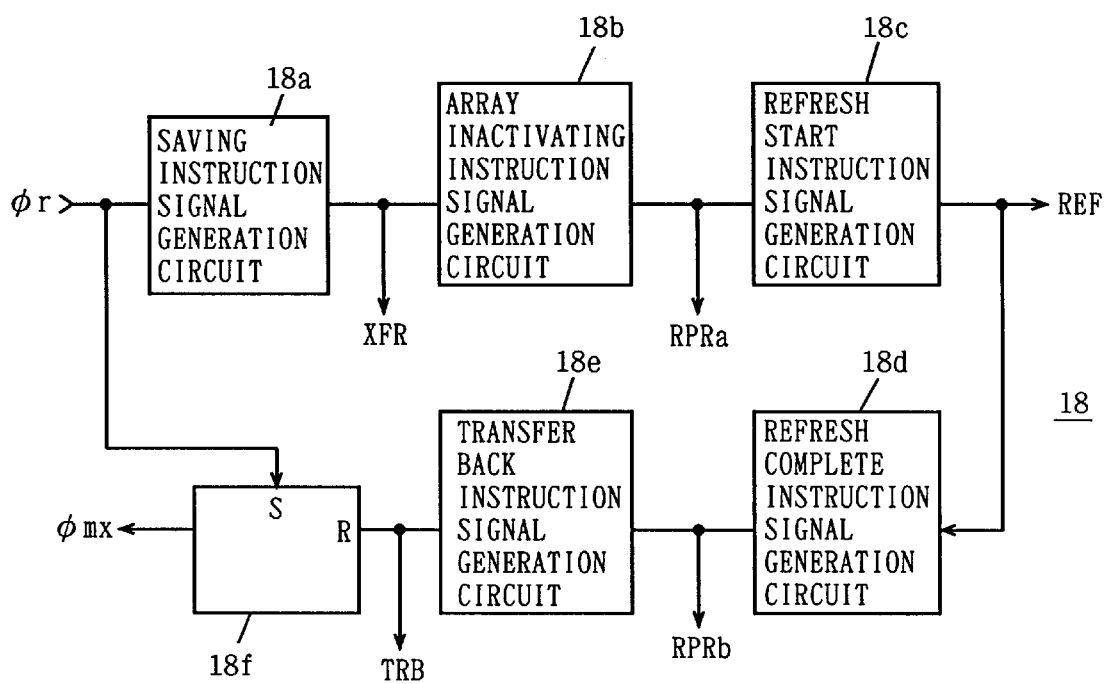
FIG. 5 schematically shows a configuration of a refresh control circuit in FIG. 1.

FIG. 5 schematically shows a configuration of refresh control circuit 18 in FIG. 1. Referring to FIG. 5, refresh control circuit 18 includes a saving instruction signal generation circuit 18*a*, for outputting one-shot saving instruction signal XFR in response to refresh instruction signal φr, an array inactivating instruction signal generation circuit 18*b* for outputting an array inactivating instruction signal RPRa to bank activation control circuit 14 (see FIG. 1) in response to saving instruction signal XFR, a refresh start instruction signal generation circuit 18*c* for supplying a refresh start instruction signal REF to bank activation control circuit 14 in response to array inactivate instruction signal RPRa, a refresh completion instructing signal generation circuit 18*d* for outputting a refresh completion instructing signal RPRb in response to refresh start instruction signal REF after a prescribed time has passed since the refresh start instruction signal is generated, a transfer back instruction signal generation circuit 18*e* for outputting a transfer back instruction signal TRB, and a set/reset flip-flop 18*f* set in response to refresh instruction signal φr and reset in response to transfer back instruction signal TRB for outputting switch instruction signal φmx.

Saving instruction signal generation circuit 18*a*, array inactivating instruction signal generation circuit 18*b* and refresh start instruction signal generation circuit 18*c* are each constituted by a one-shot pulse generation circuit. Refresh completion instructing signal generation circuit 18*d* is constituted by a delay circuit and a one-shot pulse generation circuit. The delay circuit determines a period in which a word line is selected in each array bank at the time of the refresh. Transfer back instruction signal generation circuit 18*e* is constituted by a normal one-shot pulse generation circuit.

Figure 6:
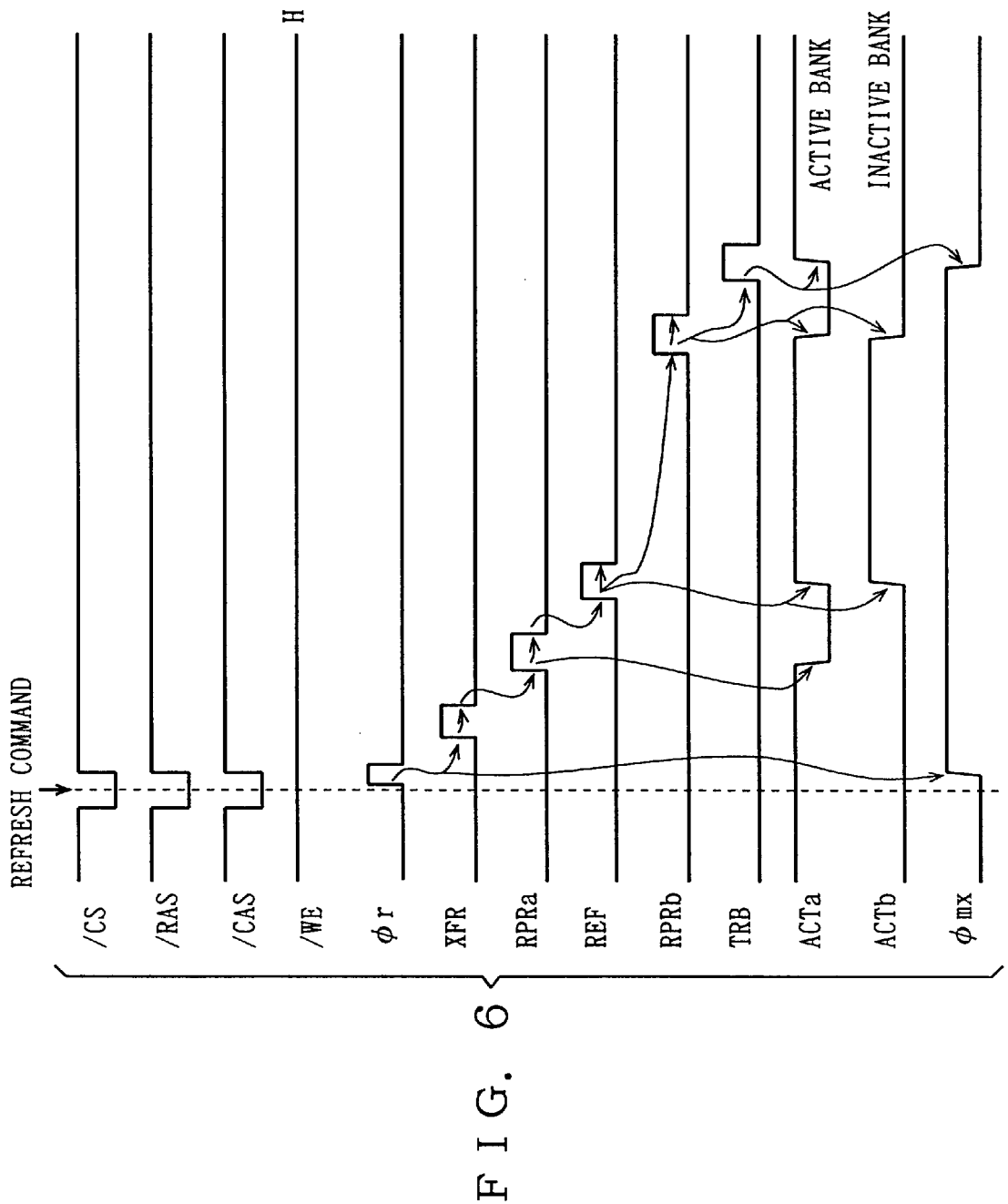
FIG. 6 is a signal waveform diagram representing an operation of the refresh control circuit in FIG. 5.

FIG. 6 is a signal waveform diagram representing an operation of refresh control circuit 18 in FIG. 5. An operation of the refresh control circuit in FIG. 5 is now described with reference to FIG. 6.

Chip selection signal /CS, row address strobe signal /RAS and column address strobe signal /CAS are set at L level and write enable signal /WE is set at H level at the rising edge of the clock signal, and a refresh command is supplied. In response to the refresh command, refresh instruction signal φr is set to the active state of H level, and saving instruction signal XFR from saving instruction signal generation circuit 18*a* is set to the active state for a prescribed period responsively. When saving of an internal row address signal in accordance with saving instruction signal XFR completes, array inactivating instruction signal RPRa is output from array inactivating instruction signal generation circuit 18*b*. Bank activation signal ACT (represented by signal ACTa in FIG. 6) which has been in the active state is driven into the inactivate state by array inactivating instruction signal RPRa. A bank activation signal for a bank which is in the inactive state when the refresh instruction is issued is represented by a signal ACTb in FIG. 6. Accordingly, all banks are driven into inactive state.

Refresh instruction signal REF is thereafter output from refresh start instruction signal generation circuit 18*c*, bank activation signals ACTa and ACTb are activated, and the refresh is carried out simultaneously in all banks. When a prescribed time has passed from the time when refresh instruction signal REF is generated, refresh completion instructing signal RPRb is output from refresh completion instructing signal generation circuit 18d. Refresh completion instructing signal RPRb causes bank activation signals ACTa and ACTb to be in the inactive state, and all banks are again driven into the inactive state. Accordingly, the refresh operation is completed.

After the completion of the refresh operation, transfer back instruction signal TRB is generated from transfer back instruction signal generation circuit 18e, and an internal row address signal before the refresh is again latched in a corresponding row address latch. An array activation signal is again transferred back, and a bank which was in the active state when the refresh command was supplied again returns back to its original active state, as described below.

Set/reset flip-flop 18f is activated in response to generation of refresh instruction signal φr and inactivated when transfer back instruction signal TRB is generated.

Figure 7:
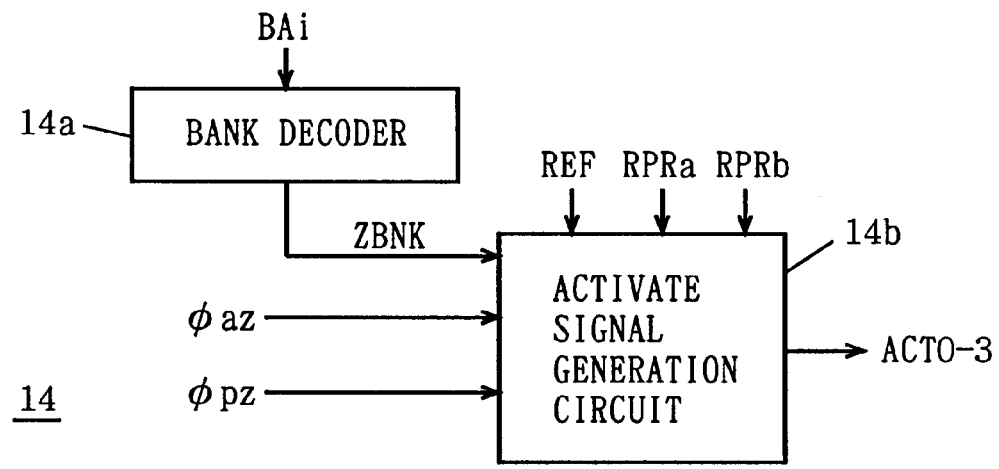
FIG. 7 schematically shows a configuration of a bank activation control circuit in FIG. 1.

FIG. 7 schematically shows a configuration of bank activation control circuit 14 shown in FIG. 1. With reference to FIG. 7, bank activation control circuit 14 includes a bank decoder 14a receiving bank address signal BAi from address buffer 6 (see FIG. 1) for decoding it to output a bank designate signal ZBNK, and an activation signal generation circuit 14b receiving bank designate signal ZBNK, an array activation instruction signal φaz and a precharge instruction signal φpz from the command decoder, and refresh start instruction signal REF, array inactivating instruction signal RPRa and refresh completion instruction signal RPRb from refresh control circuit 18, for outputting bank activation signals ACT0–3 (ACT0–ACT3) for the array banks.

In a normal operation mode (mode other than the refresh mode), activation signal generation circuit 14b controls activation/inactivation of a bank activation signal according to array activation instruction signal φaz or precharge instruction signal φpz for an array bank designated by bank designation signal ZBNK from bank decoder 14a. In the refresh operation, activation signal generation circuit 14b controls activation/inactivation of bank activation signals ACT0–ACT3 according to signals REF, RPRa and RPRb from refresh control circuit 18.

Figure 8:
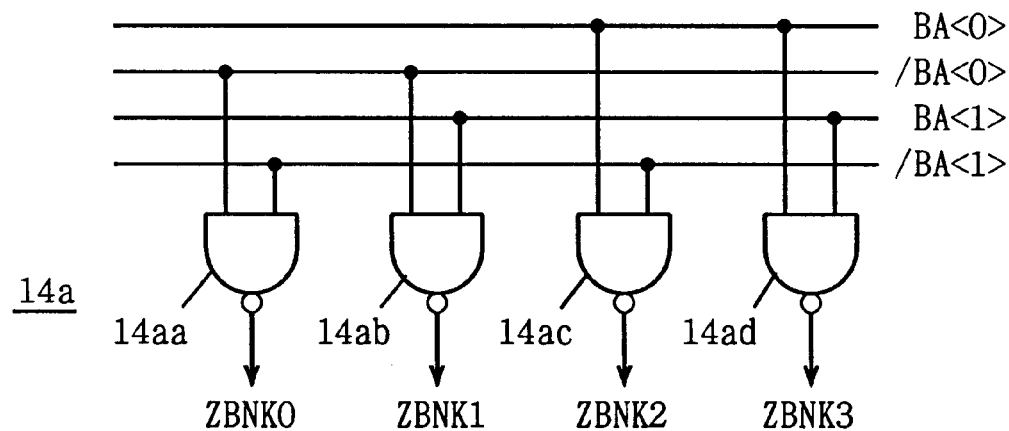
FIG. 8 shows one example of a configuration of a bank decoder in FIG. 6.

FIG. 8 shows one example of a configuration of the bank decoder shown in FIG. 7. Referring to FIG. 8, since four array banks are provided, bank decoder 14a receives 4-bit bank address signal BA<0>, /BA<0>, BA<1> and /BA<1>. Bits BA<0> and /BA<0> are complementary to each other, and bits BA<1> and /BA<1> are complementary to each other.

Bank decoder 14a in FIG. 8 includes an NAND circuit 14aa receiving bank address signal bits /BA<0> and /BA<1> for outputting bank designating signal ZBNK0, an NAND circuit 14ab receiving bank address signal bits /BA<0> and BA<1> for outputting bank designation signal ZBNK1, an NAND circuit 14ac receiving bank address signal bits BA<0> and /BA<1> for outputting bank designation signal ZBNK2, an NAND circuit 14ad receiving bank address signal bits BA<0> and BA<1> for outputting bank designation signal ZBNK3. These bank designation signals ZBNK0–ZBNK3 attain L level in the selected state indicating that corresponding array banks 0–3 of memory bank 1 are designated.

Figure 9:
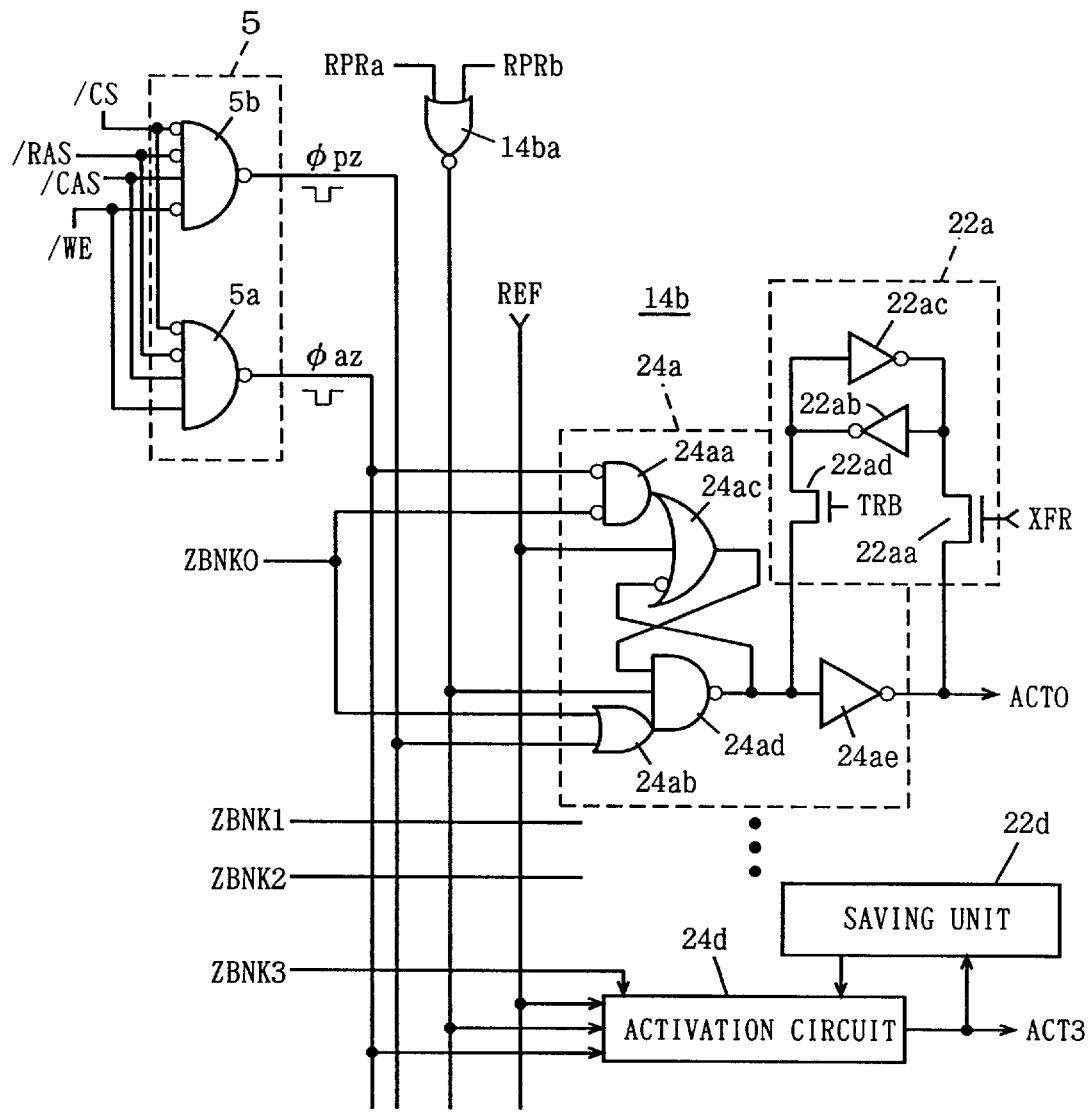
FIG. 9 shows one example of a configuration of an activation signal generation circuit in FIG. 7.

FIG. 9 shows configurations of activation signal generation circuit 14b shown in FIG. 7 and bank activating information saving circuit 22 in FIG. 1. FIG. 9 shows further configurations of active command decode circuit 5a and precharge command decode circuit 5b included in command decoder 5. Although decode circuits 5a and 5b each determine the state of a signal at the rising edge of clock signal CLK, the clock signal CLK is not shown. Command decode circuit 5a drives array activation instruction signal φaz into the active state of L level when chip selection signal /CS and row address strobe signal /RAS are at L level and column address strobe signal /CAS and write enable signal /WE are at H level. Precharge command decode circuit 5b drives precharge instruction signal φpz into the active state of L level when chip selection signal /CS, row address strobe signal /RAS and write enable signal /WE are at L level and column address strobe signal /CAS is at H level.

Activation signal generation circuit 14b includes an NOR circuit 14ba receiving array inactivate instruction signal RPRa and refresh completion instruction signal RPRb, as well as activation circuits 24a–24d provided for respective array banks of memory bank 1 and output bank activation signals ACT0–ACT3 to respective array banks 0–3. FIG. 9 specifically shows a configuration of activation circuit 24a provided to array bank 0 of memory bank 1 and outputting bank activation signal ACT0, and shows in a block form activation circuit 24d provided to array bank 3 and outputting bank activation signal ACT3. Activation circuits (outputting activation signals ACT1 and ACT2) provided to array banks 1 and 2 are omitted in this figure.

Activation circuit 24a includes an NOR gate 24aa receiving array activating instruction signal φaz from active command decode circuit 5a as well as bank designating signal ZBNK0, an OR gate 24ab receiving precharge instruction signal φpz from precharge command decode circuit 5b as well as bank designation signal ZBNK0, and a logic gate 24ac receiving an output signal from NOR gate 24aa, refresh start instruction signal REF and an output signal from NAND gate 24ad. NAND gate 24ad receives a signal output from logic gate 24ac, a signal output from NOR circuit 14ba, and a signal from OR gate 24ab. Gates 24aa and 24ac constitute a composite gate, and gates 24ab and 24ad constitute a composite gate. Activation circuit 24a further includes an inverter 24ae for inverting a signal output from NAND gate 24ad to output bank activation signal ACT0.

Those activation circuits for other array banks have the same structure, and the only difference therebetween is the bank designating signal supplied.

Activation circuits 24a–24d are respectively provided corresponding to saving units 22a–22d for saving and storing bank activation signals included in bank activating information saving circuit 22. FIG. 9 shows a configuration of saving unit 22a provided for activation circuit 24a for array bank 0 of memory bank 1. Configurations of saving units 22a–22d are identical to each other.

Saving unit 22a in FIG. 9 includes a transfer gate 22aa made conductive when saving instruction signal XFR is activated for transmitting bank activation signal ACT0, inverters 22ac and 22ab for latching bank activation signal ACT0 transmitted via transfer gate 22aa, and a transfer gate 22ad made conductive when transfer back instruction signal TRB is activated, for transferring the bank activation signal latched by inverters 22ac and 22ab back to activation circuit 24d. Transfer gate 22ad transfers the latched array bank activation signal back to an input portion of inverter 24ae included in activation circuit 24a. Signals XFR and TRB are commonly supplied to saving units 22a–22d from refresh control circuit 18 (see FIG. 1). An operation of the configuration in FIG. 9 will now be briefly described.

When an active command is supplied in the normal operation mode, array activating instruction signal φaz falls from H level to L level for a prescribed period. In this state, any one of bank designating signals ZBNK0–ZBNK3 enters in the active state. Now, assume that array bank 0 is designated. In this state, bank designating signal ZBNK0 attains the active state of L level. Accordingly, a signal output from NOR gate 24aa attains H level, and a signal output from logic gate 24ac attains H level. Precharge instruction signal φpz as well as a signal output from NOR circuit 14ba are at H level. Responsive to the rising of an output signal from logic gate 24ac, a signal output from NAND gate 24ad becomes L level, and bank activation signal ACT0 from inverter 24ae accordingly attains H level. Even if array activating instruction signal φaz and bank designating signal ZBNK0 thereafter return to H level, a signal output from NOR gate 24aa is still at L level, the logic level of the output signal from logic gate 24ac does not change, and bank activation signal ACT0 maintains the active state.

When the precharge command is applied, precharge instruction signal φpz from precharge command decode circuit 5b falls to L level. When bank designating signal ZBNK0 is still at L level, a signal output from OR circuit 24ab becomes L level, a signal output from NAND circuit 24ad becomes H level and bank activation signal ACT0 from inverter 24a becomes the inactive state of L level in activation circuit 24a.

Array activating instruction signal φaz and precharge instruction signal φpz are both at H level in the inactive state. Assume that the refresh command is supplied and refresh instruction signal φr is output from command decoder 5 (see FIG. 6). In this state, saving instruction signal XFR first attains the active state of H level, transfer gate 22aa becomes conductive, and bank activation signal ACT0 is transferred to saving unit 22a. This process is similarly performed in saving unit 22d. Array inactivating instruction signal RPRa then attains H level, a signal output from NOR circuit 14ba becomes L level. In activation circuit 24a, an output signal from NAND circuit 24ad attains H level, and bank activation signal ACT0 is accordingly driven to L level. A signal output from NOR circuit 14ba is commonly supplied to activation circuits 24a–24d, and bank activation signals ACT0–ACT3 from these activation circuits are all driven to the inactive state of L level.

Next, refresh start instruction signal REF attains the active state of H level, and in activation circuit 24a, a signal output from logic gate 24ac attains H level again, a signal output from NAND circuit 24ad responsively becomes L level, and the bank activation signal ACT0 is driven to H level. Refresh start instruction signal REF is commonly supplied to activation circuits 24a–24d, so that bank activation signals ACT0–ACT3 from activation circuits 24a–24d are all driven to the active state.

After a prescribed time has passed, refresh complete instruction signal RPRb becomes the active state of H level, a signal output from NOR circuit 14ba accordingly becomes L level, and bank activation signals ACT0–ACT3 becomes the inactive state of L level. Then transfer back instruction signal TRB attains the active state of H level. In saving unit 22a, transfer gate 22ad becomes conductive and transfers the saved bank activation signal back to activation circuit 24a. Transfer back instruction signal TRB is commonly supplied to saving units 22a–22d, and the bank activation signals saved in saving units 22a–22d are all transferred back to activation circuits 24a–24d, respectively. If bank activation signal ACT0 is in the active state of H level when the refresh instruction is supplied, a signal transferred back from saving unit 22a is at L level. Accordingly, a signal output from logic gate 24ac attains H level, a signal output from NAND gate 24ad becomes L level, and bank activation signal ACT0 again attains H level. Bank activation signal ACT0 is latched by logic gate 24ac and NAND gate 24ad. Accordingly, each array bank can be returned back to a state set when the refresh instruction is supplied.

Figure 10:
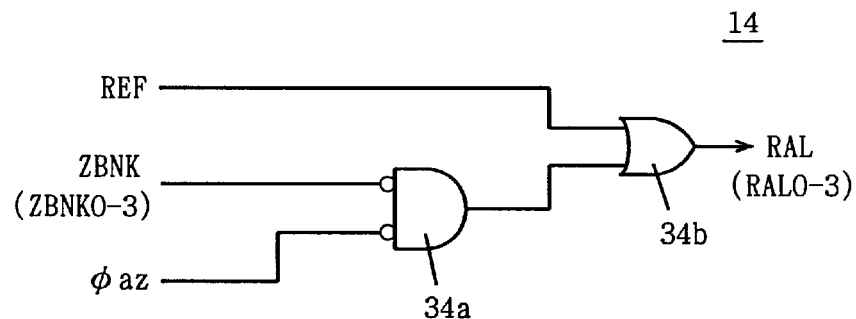
FIG. 10 shows one example of a configuration of a row address latch instruction signal generation unit included in the activation signal generation circuit in FIG. 7.

FIG. 10 shows a configuration of a unit by which an address latch instruction signal is generated. In FIG. 10, a configuration of the address latch instruction signal generation unit for one array bank is shown. The latch instruction signal generation unit shown in FIG. 10 is provided to each row address latch provided corresponding to each respective array bank. The latch instruction signal generation unit is included in bank activation control circuit 14.

With reference to FIG. 10, the address latch instruction signal generation unit includes an NOR circuit 34a receiving bank designating signal ZBNK (ZBNK0–ZBNK3) as well as array activating instruction signal φaz, and an OR circuit 34b receiving a signal output from NOR circuit 34a and refresh start instruction signal REF. Row address latch instruction signal RAL (RAL0–RAL3) is output from OR circuit 34b. The circuit configuration shown in FIG. 10 is provided to each of row address latches 3a–3d (see FIG. 2).

In the normal operation mode, an active command is supplied to activate row address latch instruction signal RAL for the row address latch provided corresponding to the array bank designated by the bank address signal. In the refresh mode, when refresh start instruction signal REF is activated, row address latch instruction signals RAL0–RAL3 for all of the row address latches are activated for a predetermined period, and a refresh address from the refresh counter is taken and the refresh is carried out.

According to the configuration shown in FIG. 10, the timing at which a row address is taken and latched when an active command is supplied to activate bank activating instruction signal ACT in the normal mode and is made the same as the timing at which a refresh address is taken and latched when the refresh is carried out. As a result, the row select operation can be carried out at the same timing in both of the refresh mode and the normal operation mode.

According to the first embodiment of the invention, the bank information on each array bank is saved and the refresh is carried out under this state, and each bank is returned back to its original state after the refresh is completed in the refresh mode. As a result, the external controller is required only to supply the refresh instruction, so that the load of the external controller for the refresh is reduced. In addition, the array internal states return back to their original states simultaneously after the refresh, so that the number of the clock cycles from the refresh to return back of the array internal states to original states is decreased to reduce the penalty at the refresh.

Second Embodiment

Figure 11:
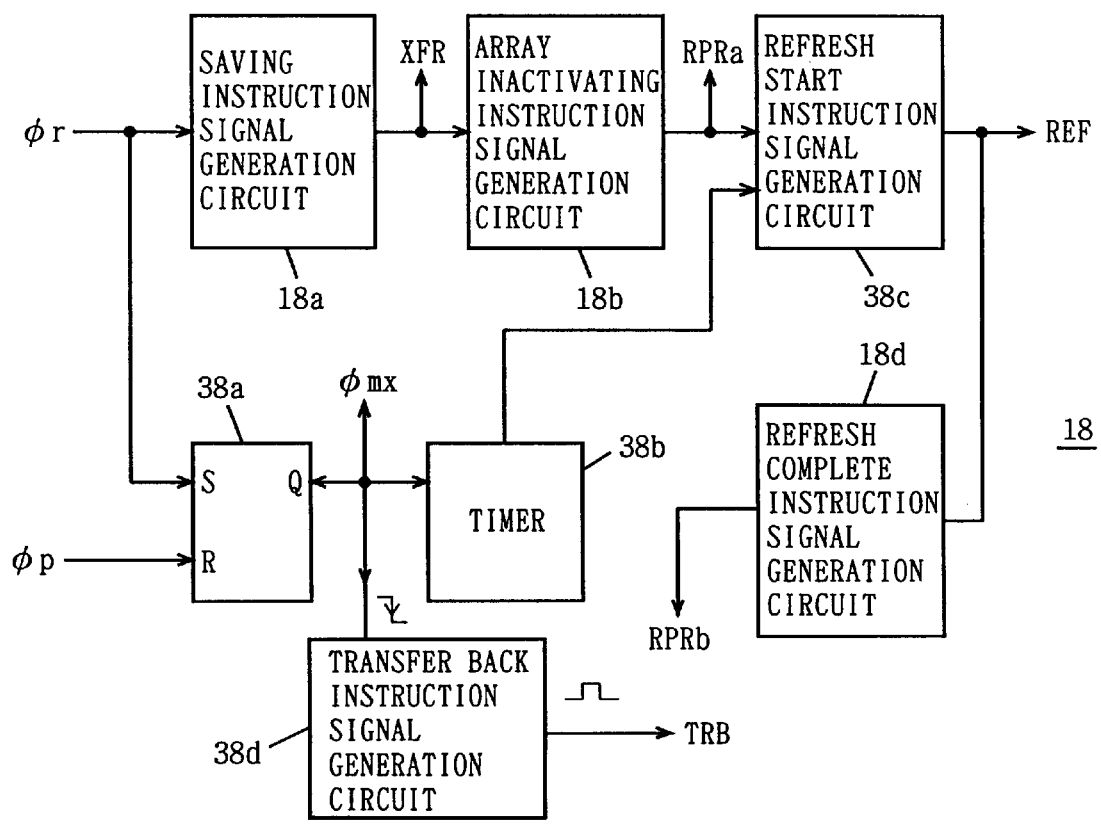
FIG. 11 schematically shows a configuration of a refresh control circuit in a semiconductor memory device according to the second embodiment of the invention.

FIG. 11 shows a configuration of a main portion of a semiconductor memory device according to the second embodiment of the invention. In FIG. 11, a configuration of a refresh control circuit is shown. Other configuration of the device is similar to that shown in FIG. 1.

With reference to FIG. 11, refresh control circuit 18 includes: a saving instruction signal generation circuit 18a responsive to refresh instruction signal φr for outputting saving instruction signal XFR; an array inactivating instruction signal generation circuit 18b responsive to saving instruction signal XFR from saving instruction signal generation circuit 18a for outputting array inactivating instruction signal RPRa; a set/reset flip-flop 38a set in response to refresh instruction signal φr and reset in response to precharge instruction signal φp; a timer 38b started when a signal output from output Q of flip-flop 38a is activated for carrying out a counting operation to output an activation signal each time a prescribed time passes; a refresh start instruction signal generation circuit 38c responsive to array inactivating instruction signal RPRa from array inactivating instruction signal generation circuit 18b and a counting up signal from timer 38b for outputting refresh start instruction signal REF; a refresh complete instruction signal generation circuit responsive to refresh start instruction signal REF from refresh start instruction signal generation circuit 38c for outputting refresh complete instruction signal RPRb after a prescribed time passes; and a transfer back instruction signal generation circuit 18d responsive to the reset of set/reset flip-flop 38a for outputting transfer back instruction signal TRB after a prescribed time passes. Switching instruction signal φmx is also output from output Q of set/reset flip-flop 38a.

In the refresh control circuit shown in FIG. 11, the refresh is repeated at an interval of a prescribed time under the control by internal timer 38b until a precharge command is supplied after the refresh is carried out according to a supplied refresh instruction. The refresh carried out as above is the self-refresh. During the self-refresh mode, the saved bank information needs to be held. Therefore, transfer back instruction signal TRB is output when a precharge command is supplied for completing the self-refresh.

Figure 12:
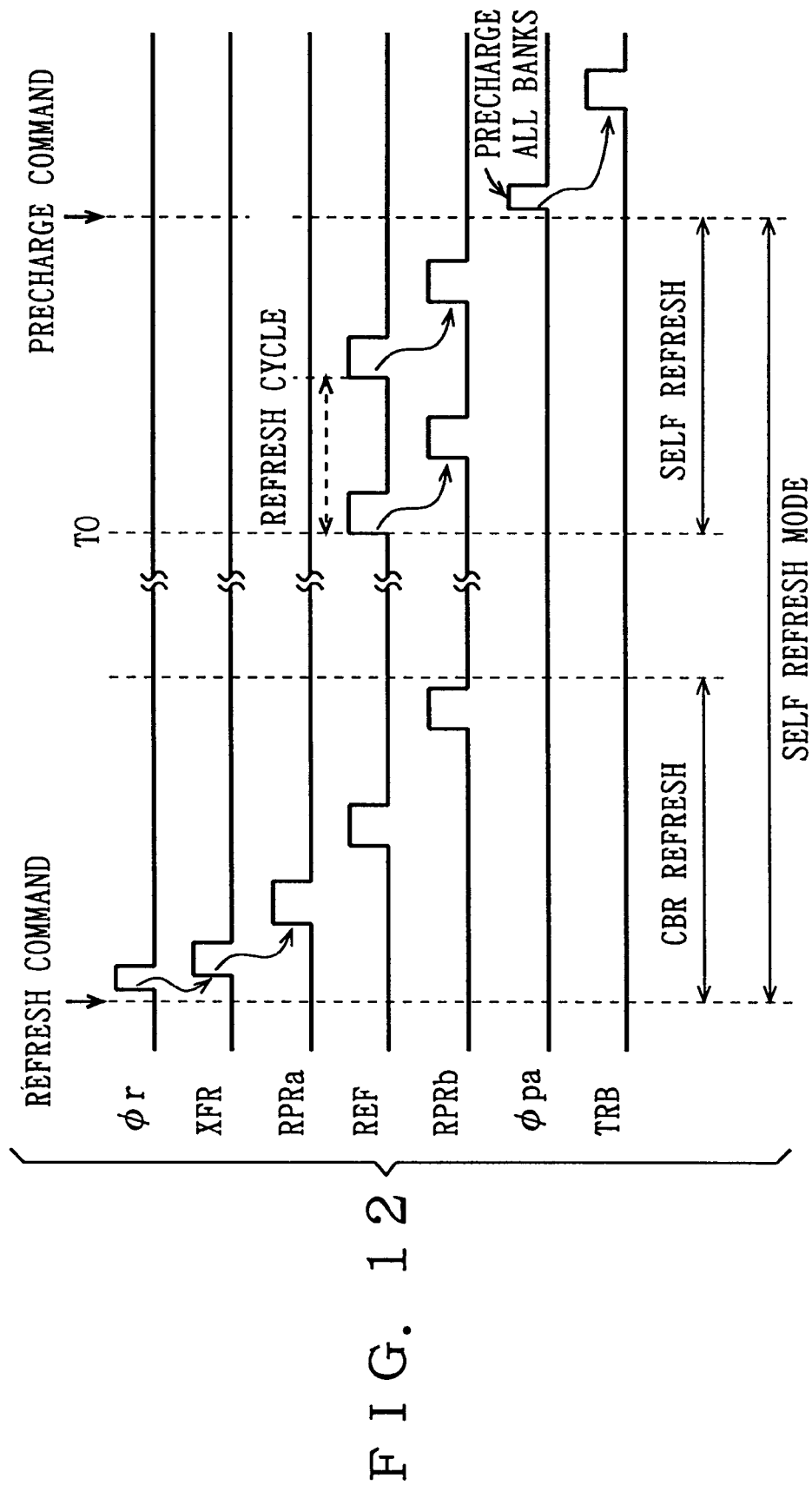
FIG. 12 is a signal waveform diagram representing an operation of the refresh control circuit in FIG. 11.

FIG. 12 is a signal waveform diagram representing an operation of refresh control circuit 18 in FIG. 11. An operation of refresh control circuit 18 in FIG. 11 is now described referring to the signal waveform diagram of FIG. 12.

When a refresh command is supplied, refresh instruction signal φr is activated and saving instruction signal XFR is output from saving instruction signal generation circuit 18a. Then, array inactivating instruction signal generation circuit 18b outputs array inactivating instruction signal RPRa to drive all of the banks in the active state to the inactive state after bank information (row address signal and array activation signal) is saved by the transfer operation.

After the entire array is inactivated (after the time required for the normal precharge passes since inactivating instruction signal RPRa is generated), refresh start instruction signal generation circuit 38c generates refresh start instruction signal REF. According to refresh start instruction signal REF, the refresh operation is carried out in the array bank according to the refresh address as in the first embodiment. When a prescribed time passes, refresh complete instruction signal RPRb is generated from refresh complete instruction signal generation circuit 18d, and the refresh of the array banks is completed, and each array bank is driven to the inactive state.

This refresh cycle is generally referred to as CBR refresh or auto refresh. Timer 38b carries out the counting operation after the refresh command is supplied. If a precharge command is not supplied even after a prescribed time passes since the refresh command is supplied, timer 38b generates a count-up signal and supplies it to refresh start instruction signal generation circuit 38c at time T0. Refresh start instruction signal generation circuit 38c responsively generates refresh start instruction signal REF, and then refresh complete instruction signal generation circuit 18d outputs refresh complete instruction signal RPRb after the refresh is carried out. This operation is repeated until a precharge command is applied to reset set/reset flip-flop 38a. The refresh carried out under the control by timer 38b is referred to as self-refresh. Timer 38b outputs a count-up signal at a prescribed time intervals to activate refresh start instruction signal REF.

In order to complete the self refresh mode, a precharge command is supplied. The precharge command activates precharge instruction signal φp and resets set/reset flip-flop 38a. The precharge command is supplied to all of the array banks. (The single bank precharge command and the all bank precharge command are switched by a specific address signal bit, for example, a bit Ad10.) Accordingly all array banks are precharged to be inactivated. After RAS precharge time (time required for precharge of an array) has passed, transfer back instruction signal generation circuit 38d generates transfer back instruction signal TRB in response to the inactivation of the output signal from set/reset flip-flop 38a. As a result, signals saved in row address saving circuit 20 and bank activating information saving circuit 22 (see FIG. 1) are transferred back to row address latch circuit 3 and bank drive unit 2, and the array banks return back to the states before the refresh command was supplied.

In the semiconductor memory device in which the self refresh mode shown in FIG. 11 is carried out, bank information (row address signal and array activation signal for each bank) is internally saved until a self refresh completing command is supplied. Consequently, high-speed returning back to the state before refresh is internally realized when the self refresh completes, and the penalty at the refresh can be reduced.

The configurations of row address saving circuit 20 and bank activate information saving circuit 22 according to the second embodiment are similar to those according to the first embodiment, and the configuration of bank activation control circuit 14 is also the same as that in the first embodiment. In addition, in order to carry out the precharge for all banks simultaneously when the refresh completing command for completing the self refresh is supplied, the all-bank precharge instruction signal generated upon application of the all-bank precharge command needs only to be supplied to NAND gate 24ad as the all-bank precharge instruction signal of negative logic in the configuration of bank activation circuit 24a shown in FIG. 9. Accordingly, the single bank precharge command and the all bank precharge command can be realized.

Figure 13:
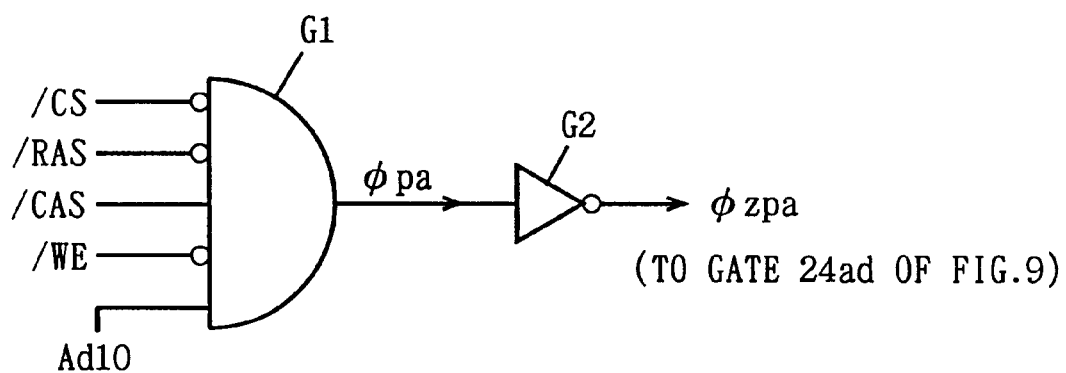
FIG. 13 schematically shows one example of a configuration of an all-bank precharge command decoder.

Specifically, referring to FIG. 13, chip selection signal /CS, row address strobe signal /RAS and write enable signal /WE are set at L level, and a particular address signal bit Ad (Add10) and column address strobe signal /CAS are set at H level, so that all-bank precharge instruction signal φpa of positive logic is output from gate circuit G1, and the all-bank precharge instruction signal φpa of positive logic is converted to all-bank precharge instruction signal φzpa of negative logic by inverter G2 and supplied to gate 24ad shown in FIG. 9. By supplying the signal φzpa commonly to bank activation circuits 24a–24d shown in FIG. 9, all banks can be precharged simultaneously.

According to the second embodiment, the penalty at the time of the return back from the refresh can be reduced in the semiconductor memory device capable of carrying out the self refresh mode operation, and at the time of the return from the self refresh, each bank can recovers the state before the self refresh easily and at a high-speed.

Third Embodiment

Figure 14:
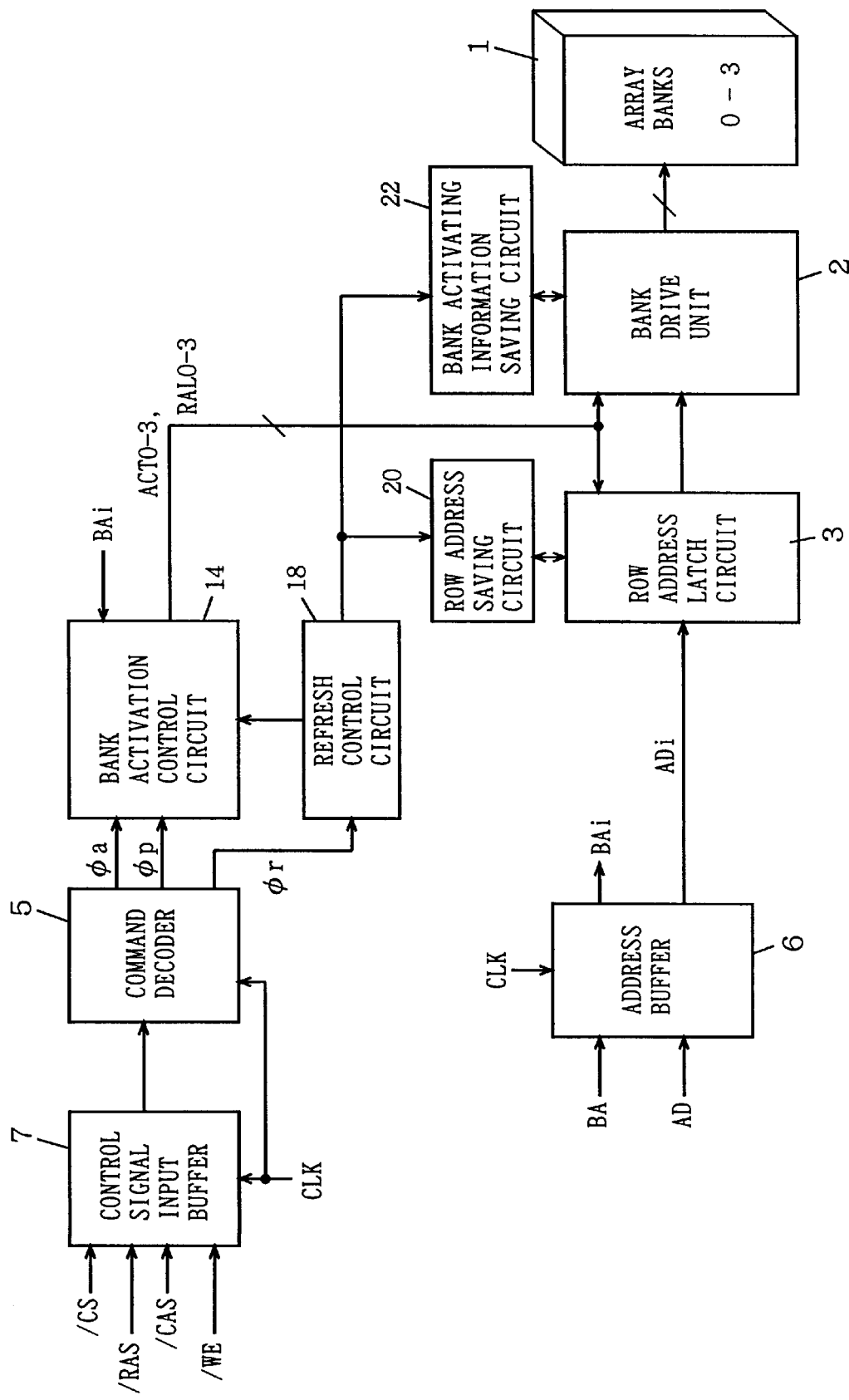
FIGS. 14 and 15 respectively show entire configurations of semiconductor memory devices according to the third and fourth embodiments of the invention.

FIG. 14 schematically shows an entire configuration of a semiconductor memory device according to the third embodiment of the invention. In the configuration of FIG.

14, the refresh counter for generating a refresh address as well as a multiplexer for selecting the refresh address instead of an address signal externally supplied in the refresh mode are not provided. The refresh address is externally supplied to the semiconductor memory device in the arrangement of FIG. 14. The refresh operation similar to "RAS only refresh" in a normal standard DRAM is carried out.

Other configuration is similar to that of the semiconductor memory device according to the first embodiment shown in FIG. 1, and corresponding components have the same reference allotted. In the configuration of FIG. 14, the refresh counter and the multiplexer are not required to be internally provided, and which row is refreshed in each array bank can be easily monitored externally.

In the configuration shown in FIG. 14, the row address signal latched in row address latch circuit 3 is saved in row address saving circuit 20 when the refresh command is supplied. In addition, the bank activation signal supplied to bank drive unit 2 is saved in bank activating information saving circuit 22. In this state, array banks 0–3 in memory bank 1 are refreshed according to address signal AD externally supplied via address buffer 6. If the time required for saving in row address saving circuit 20 and bank activating information saving circuit 22 at the time of the refresh is approximately equal to the time required from an activation of the bank designating signal to the subsequent activation of the bank activation signal by the normal bank decoder the timing at which the address signal is latched in row address latch circuit 3 can be set to be the same in both of the normal operation mode and the refresh operation mode in the configuration in which the refresh address signal is externally supplied. Further, the external controller can supply an address signal by setting the set up time and the hold time of an address to be the same in both the normal operation mode and the refresh mode, so that the load of the external controller is not increased.

According to the third embodiment, the refresh address signal is externally supplied, the refresh is carried out with activation information for each bank saved, and each array bank is returned back to a state which is the same as that before the refresh after the refresh is completed. Since the refresh address is externally supplied, a row under refresh can be easily identified externally. Internal refresh counter and multiplexer are not necessary and the chip occupation area can be reduced.

Fourth Embodiment

Figure 15:
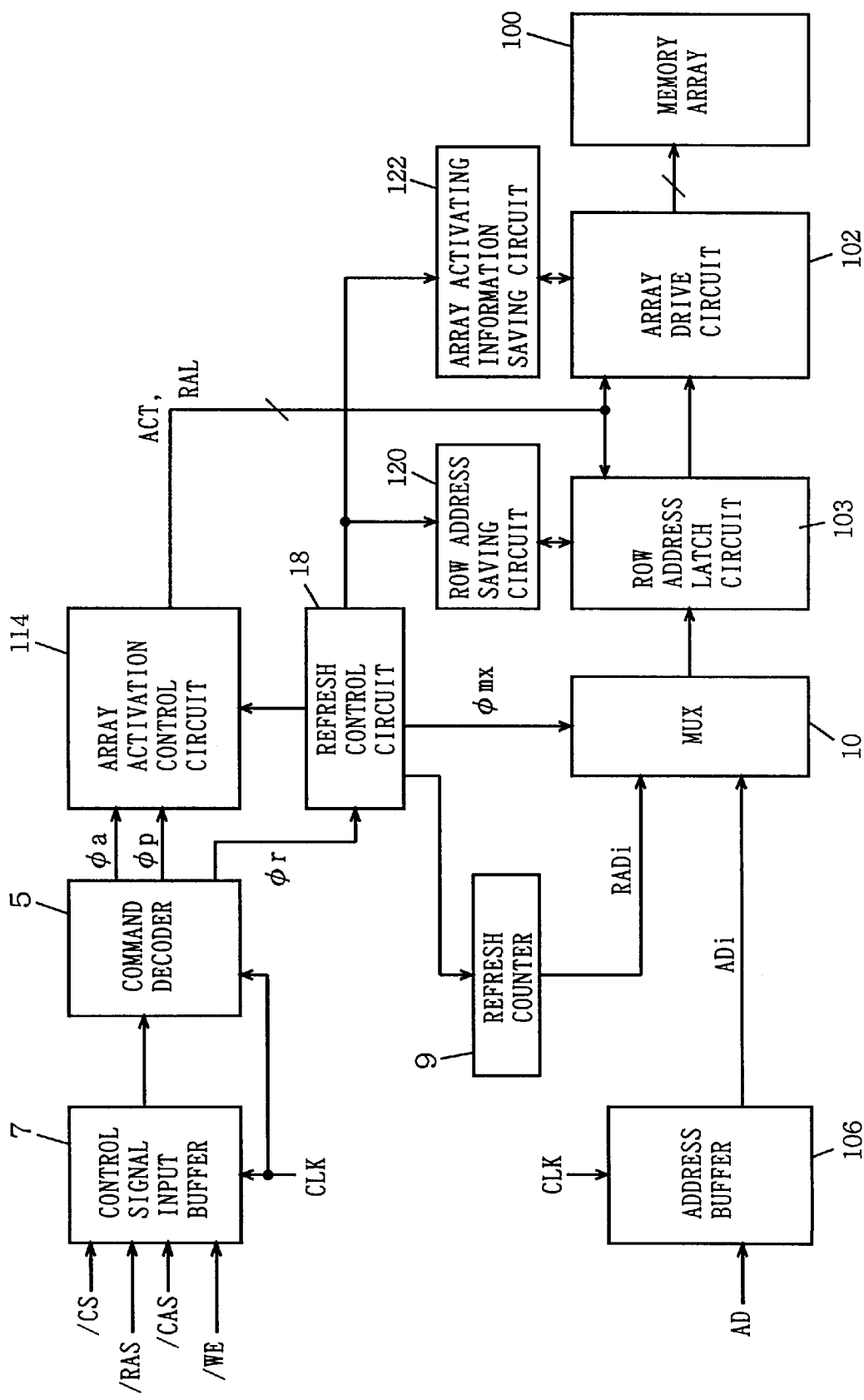
Figure 1:
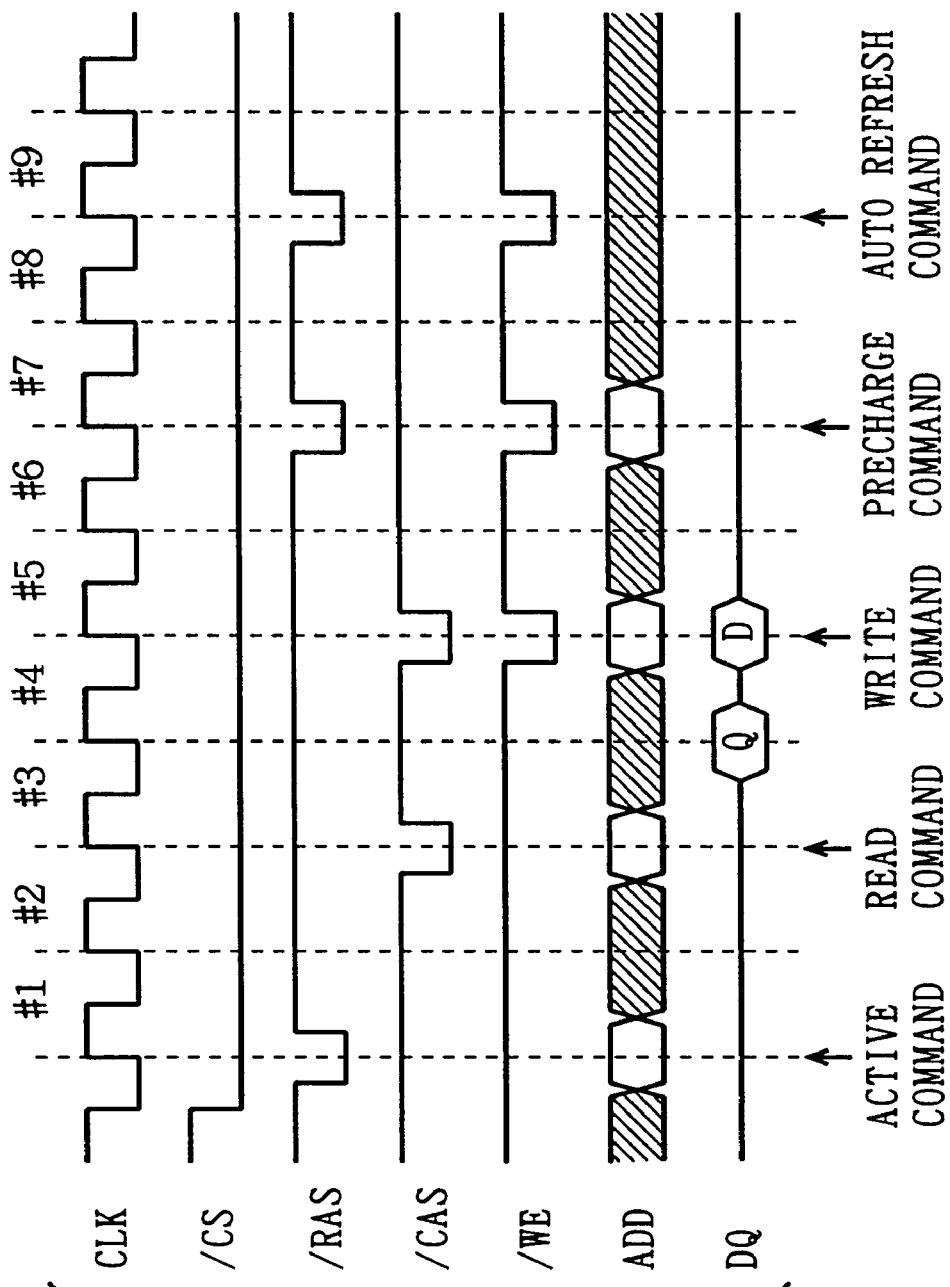
Figure 17:
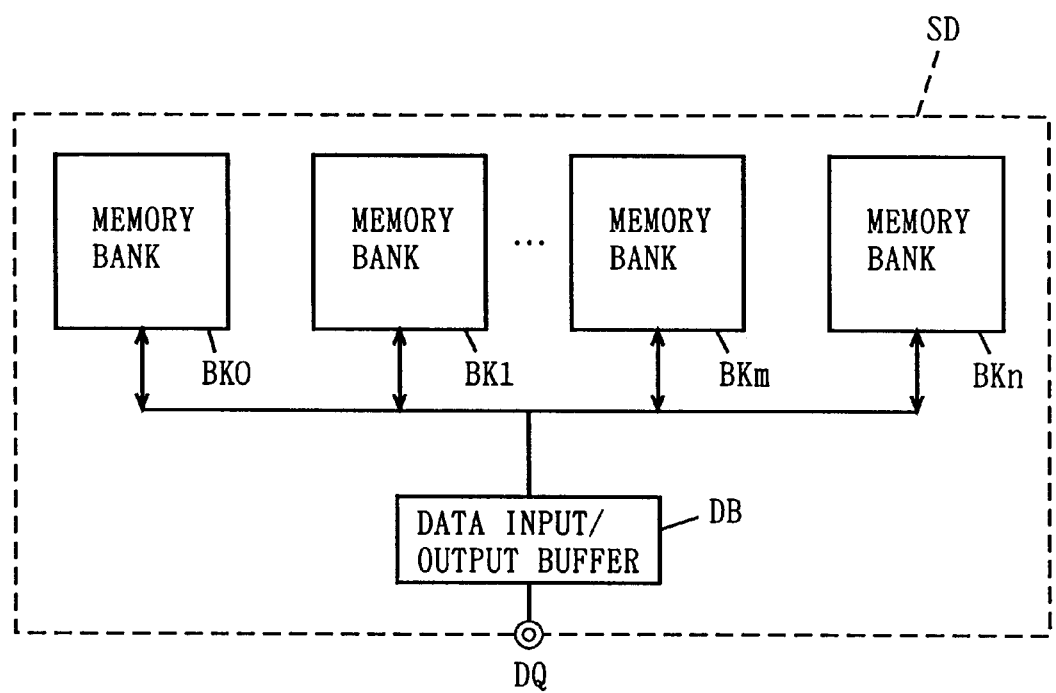
FIG. 17 schematically shows an entire configuration of a conventional synchronous semiconductor memory device.

FIG. 15 schematically shows an entire configuration of a semiconductor memory device according to the fourth embodiment. The semiconductor memory device shown in FIG. 15 includes a memory array 100. Although memory array 100 includes a plurality of memory cells arranged in a matrix of rows and columns, it has not the bank configuration. Since the memory array does not have the bank configuration, the semiconductor memory device controls activation/inactivation of the array instead of that of bank by bank.

The semiconductor memory device includes: an array activation control circuit 114 for outputting an array activation signal ACT and a row address latch instruction signal RAL according to an array activating instruction signal φa and a precharge instruction signal φp from command decoder 5 and a control signal from refresh control circuit 18; a row address latch circuit 103 for latching an address signal supplied via multiplexer 10 under the control by array activation control circuit 114; and an array drive circuit 102 for driving memory array 100 into active/inactive state according to array activation signal ACT from array activation control circuit 114.

Row address latch circuit 103 latches the row address signal supplied via multiplexer 10 according to row address latch instruction signal RAL from array activation control circuit 114. Array drive circuit 102 drives array activation signal ACT corresponding to an internal row address strobe signal controlling an operation related to the row selection for memory array 100, similarity to the row-related control circuit of the normal standard DRAM.

Multiplexer 10 receives an address signal from each of refresh counter 9 and address buffer 106. Address buffer 106 is supplied with externally supplied address signal AD only, not with a bank address signal. A row address saving circuit 120 and an array activating information saving circuit 122 are provided respectively corresponding to row address latch circuit 103 and array drive circuit 102. Row address saving circuit 120 and array activating information saving circuit 122 save a row address latched by row address latch circuit 103 and an array activation signal of array drive circuit 102 under the control by refresh control circuit 18. Control signal input buffer 7, command decoder 5, refresh control circuit 18, refresh counter 10 and multiplexer (MUX) 10 have configurations similar to those according to the first or the second embodiment. One bank can be considered to be one memory array in this embodiment.

In the semiconductor memory device shown in FIG. 15, memory array 100 is activated/inactivated under the control by array drive circuit 102. The semiconductor memory device shown in FIG. 15 is equivalent to the semiconductor memory device according to the first or the second embodiment including one bank. Therefore, in the semiconductor memory device of FIG. 15, the array is internally precharged automatically when the refresh command is supplied to carry out the refresh, and the array returns back to the inactive state after the refresh if the array was in the inactive state upon application of instruction refresh. Even if the number of the bank is one and the array does not have the bank structure, to supply the active command externally again after completion of the refresh for returning the memory array back to the state before the refresh. After the refresh, access to the memory array is possible by supplying the read command or the write command and the penalty at the time of the refresh can be reduced. In addition, the refresh address may be externally supplied as in the third embodiment.

Other Application

The SDRAM is presented as one example of the synchronous semiconductor memory device having data input/output synchronously with the clock signal in the description above. However, the present invention can be applied to any semiconductor memory device in which the refresh operation is necessary and the operation mode instruction is supplied in a command form. For example, the invention is applicable to a semiconductor memory device having data input/output at both of the rising and falling edges of the clock signal, and the external control signal and the address signal successively taken at the rising and falling edges of the clock signal.

According to the present invention, when a refresh instruction is supplied, information on each array is saved and then the refresh is carried out, and the information on the array is transferred back after the completion of the refresh and the array is returned back to its original state. Consequently, the load of the external controller at the time of refresh is reduced, the array can be returned back to its original state at high speed after the refresh completes, the penalty at the refresh is reduced, and correspondingly the waiting time of a processor can be decreased. A system having a superior processing performance can thus be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells each requiring refreshing of storage information within a prescribed time, comprising:

address generation means including address storage means, for receiving a supplied address signal to generate an internal address signal and to store the internal address signal in said address storage means;

memory cell selection means for selecting a memory cell addressed according to said internal address signal;

address saving means responsive to a refresh instruction for receiving and holding said internal address signal stored in said address storage means of said address generation means;

refresh activation means responsive to said refresh instruction for supplying said memory cell selection means with a refresh address designating a memory cell to be refreshed via said address generation means and activating said memory cell selection means; and re-set means for setting, when a refresh operation completes, a memory cell being in a selected state when said refresh instruction is supplied into the selected state according to the address signal from said address saving means.

2. The semiconductor memory device according to claim 1, wherein said re-set means includes:

means for transferring said internal address signal saved in said address saving means to said address generation means in response to completion of the refresh operation;

activation signal holding means for holding a signal representing whether a memory cell is in the selected state upon application of the refresh instruction; and means for activating said memory cell selection means according to the signal held in said activation signal holding means and to completion of said refresh operation.

3. The semiconductor memory device according to claim 1, wherein said refresh activation means includes means for supplying an externally supplied address signal to said address generation means as said refresh address signal.

4. The semiconductor memory device according to claim 1, wherein said refresh activation means includes:

refresh address generation means responsive to said refresh instruction being active for generating an address signal; and selection means for receiving an externally supplied address signal and the address signal from said refresh generation means and responsive to said refresh instruction being active for selecting said address signal from said refresh generation means for application to said internal address generation means as said refresh address.

5. The semiconductor memory device according to claim 1, wherein said refresh activation means includes circuitry responsive to said refresh instruction being active for activating said memory cell selection means at predetermined time intervals and for generating a different refresh address at said predetermined time intervals.

6. A semiconductor memory device comprising:

a plurality of memory banks each having a plurality of memory cells, the memory banks driven into an active and an inactive state independently from each other and each requiring refreshing of storage data within a prescribed time;

a plurality of memory cell selection means provided corresponding to said plurality of memory banks, for selecting an addressed memory cell in a corresponding memory bank according to an address signal supplied when activated;

internal address generation means, receiving a bank address signal designating a bank and for generating an internal address signal according to an externally supplied address signal for application to a memory cell selection means provided corresponding to a memory bank designated by said bank address signal, said internal address generation means including address storage means for holding the generated internal address signal;

address saving means responsive to a refresh instruction instructing the refreshing for saving and storing said internal address signal held in said address storage means;

refresh activation means responsive to said refresh instruction for supplying a refresh address designating a memory cell to be refreshed to said plurality of memory cell selection means via said internal address generation means, and for activating said plurality of memory cell selection means; and re-set means responsive to completion of the refreshing instructed by said refresh instruction completes, for transferring said internal address signal saved in said address saving means to said address storage means and for activating memory cell selection means provided corresponding to a memory bank being in an active state upon application of said refresh instruction.

7. The semiconductor memory device according to claim 6, wherein said internal address generation means includes a plurality of internal address generation circuits provided correspondingly to said plurality of memory banks respectively and each for taking said externally supplied address signal to generate the internal address signal when addressed by said bank address signal, and said address saving means includes a plurality of address saving circuits provided corresponding to said plurality of internal address generation circuits respectively.

8. The semiconductor memory device according to claim 6, further comprising bank activation means for activating memory cell selection means provided corresponding to a memory bank designated by said bank address signal in accordance with said bank address signal and an externally supplied memory cell selection instruction, wherein said re-set means includes:

bank saving means responsive to said refresh instruction for saving and storing a bank activation signal from said bank activation means; and means responsive to completion of the refreshing instructed by said refresh instruction for transferring said bank activation signal saved in said bank saving means to said bank activation means to activate a memory cell selection circuit a corresponding memory bank.

9. The semiconductor memory device according to claim 8, wherein said bank activation means includes a plurality of activation signal holding circuits provided corresponding to said plurality of memory banks respectively and each for holding a bank activation signal for a corresponding memory bank, said bank saving means includes a plurality of saving circuits provided corresponding to said plurality of activation signal holding circuits respectively and each for receiving and holding a bank activation signal from a corresponding holding circuit in response to said refresh instruction, and said re-set means includes a plurality of transfer circuits for transferring a bank activation signal held in each of said plurality of saving circuits to a corresponding activation signal holding circuit after said refreshing completes.

10. The semiconductor memory device according to claim 6, wherein said refresh activation means includes means responsive to said refresh instruction for taking an externally supplied address signal for supply to said plurality of memory cell selection means as said refresh address signal.

11. The semiconductor memory device according to claim 6, wherein said refresh activation means includes refresh address generation means responsive to said refresh instruction for generating a refresh address signal, and means for receiving an externally supplied address signal and said refresh address signal supplied from said refresh address generation means, and responsive to said refresh instruction for selectively passing said refresh address signal to said plurality of memory cell selection means.

12. The semiconductor memory device according to claim 6, wherein said refresh activation means includes circuitry responsive to said refresh instruction being active to instruct the refreshing, for generating a different address signal as said refresh address and activating said plurality of memory cell selection means at predetermined time intervals.

13. A semiconductor memory device comprising:

at least one array including a plurality of memory cells;

memory cell drive circuitry provided corresponding to said at least one array, for driving said at least one array into a selected state in accordance with an applied address signal when activated;

address generation circuitry including an address latch, for generating and latching an address signal for application to said at least one array;

array activation circuitry for generating an array activation signal for activating said meaning cell drive circuitry;

address saving circuitry coupled to said address generation circuitry, for saving the address signal latched in said address latch;

activation saving circuitry coupled to said array activation circuitry, for saving the array activation signal; and refresh control circuitry responsive to activation of a refresh instruction instructing refreshing of data of the memory cells, for transferring the address signal latched in the address latch and the array activation signal generated by said array activation circuitry into the address saving circuitry and said activation saving circuitry respectively for saving therein, for inactivating the array activation signal generated from said array activation circuitry in response to the saving, for applying a refresh address signal designating a memory cell to be refreshed to said memory cell drive circuitry through said address generation circuitry and activating said array activation circuitry for a predetermined time in response to the inactivation of the array activation signal, and for transferring back the saved address signal and array activation signal to the address latch and the array activation circuitry respectively in response to inactivation of said refresh instruction instructing completion of the refreshing.

14. The semiconductor memory device according to claim 13, wherein said at least one array is divided into a plurality of array banks driven into an active and an inactive state independently of each other.

* * * * *